(12) United States Patent
Maehashi et al.

(10) Patent No.: US 12,514,015 B2
(45) Date of Patent: Dec. 30, 2025

(54) PHOTOELECTRIC CONVERSION DEVICE HAVING A SEMICONDUCTOR REGION ARRANGED IN A SUBSTRATE AND HAVING A PLURALITY OF REGIONS ALONG A SURFACE OF THE SUBSTRATE

(71) Applicant: CANON KABUSHIKI KAISHA, Tokyo (JP)

(72) Inventors: Yu Maehashi, Tokyo (JP); Keita Torii, Kanagawa (JP); Takayuki Suzuki, Kanagawa (JP); Junji Iwata, Tokyo (JP)

(73) Assignee: CANON KABUSHIKI KAISHA

( * ) Notice: Subject to any disclaimer, the term of this patent is extended or adjusted under 35 U.S.C. 154(b) by 639 days.

(21) Appl. No.: 17/932,778

(22) Filed: Sep. 16, 2022

(65) Prior Publication Data

US 2023/0115792 A1     Apr. 13, 2023

(30) Foreign Application Priority Data

Oct. 8, 2021    (JP) .................................. 2021-166309

(51) Int. Cl.
*H10F 39/00*      (2025.01)
*H10F 30/225*      (2025.01)

(52) U.S. Cl.
CPC ......... *H10F 39/807* (2025.01); *H10F 30/225* (2025.01); *H10F 39/8057* (2025.01)

(58) Field of Classification Search
CPC .... H10F 30/225; H10F 77/50; H10F 39/8057; H10F 39/807; H04N 25/773
See application file for complete search history.

(56) References Cited

U.S. PATENT DOCUMENTS

| 8,598,901 B2 | 12/2013 | Hiyama |
| 8,648,944 B2 | 2/2014 | Iwata |
| 8,697,500 B2 | 4/2014 | Iwata |
| 8,711,259 B2 | 4/2014 | Maehashi |
| 9,407,847 B2 | 8/2016 | Maehashi |
| 9,543,340 B2 | 1/2017 | Iwata |
| 9,762,840 B2 | 9/2017 | Yamazaki |
| 9,979,916 B2 | 5/2018 | Hiyama |
| 9,986,194 B2 | 5/2018 | Maehashi |

(Continued)

FOREIGN PATENT DOCUMENTS

| JP | 2021-197401 A | 12/2021 |
| WO | 2018/139279 A1 | 8/2018 |

OTHER PUBLICATIONS

Japanese Office Action issued Jul. 1, 2025 during prosecution of related Japanese patent application No. 2021-166309 (English-language machine translation included).

*Primary Examiner* — Nelson Garces
(74) *Attorney, Agent, or Firm* — VENABLE LLP

(57) ABSTRACT

A photoelectric conversion device includes a substrate, a photoelectric conversion unit arranged in the substrate and configured to generate charges corresponding to incident light, and a pixel isolation portion arranged in the substrate and isolating the photoelectric conversion unit from other elements. A sidewall of the pixel isolation portion has a plurality of depressions and protrusions in a cross-sectional view. A period of at least a part of the plurality of depressions and protrusions is greater than ½ of a wavelength of light to which the photoelectric conversion unit has sensitivity.

18 Claims, 26 Drawing Sheets

(56) References Cited

U.S. PATENT DOCUMENTS

| | | |
|---|---|---|
| 10,121,816 B2 | 11/2018 | Iwata |
| 10,818,715 B2 | 10/2020 | Iwata |
| 10,833,207 B2 | 11/2020 | Iwata |
| 10,971,539 B2 | 4/2021 | Maehashi |
| 11,056,519 B2 | 7/2021 | Inui |
| 11,057,551 B2 | 7/2021 | Nishide |
| 11,094,731 B2 | 8/2021 | Seto |
| 11,121,160 B2 | 9/2021 | Suzuki |
| 11,240,453 B2 | 2/2022 | Maehashi |
| 11,393,870 B2 | 7/2022 | Inui |
| 2020/0135793 A1 | 4/2020 | Torii |
| 2021/0118924 A1 | 4/2021 | Tamaki |
| 2021/0296383 A1 | 9/2021 | Inui |
| 2021/0297565 A1 | 9/2021 | Nishide |
| 2023/0268365 A1* | 8/2023 | Kurata ................ H10F 30/225 257/432 |
| 2023/0300492 A1* | 9/2023 | Kambe ................ H04N 25/62 257/431 |

* cited by examiner

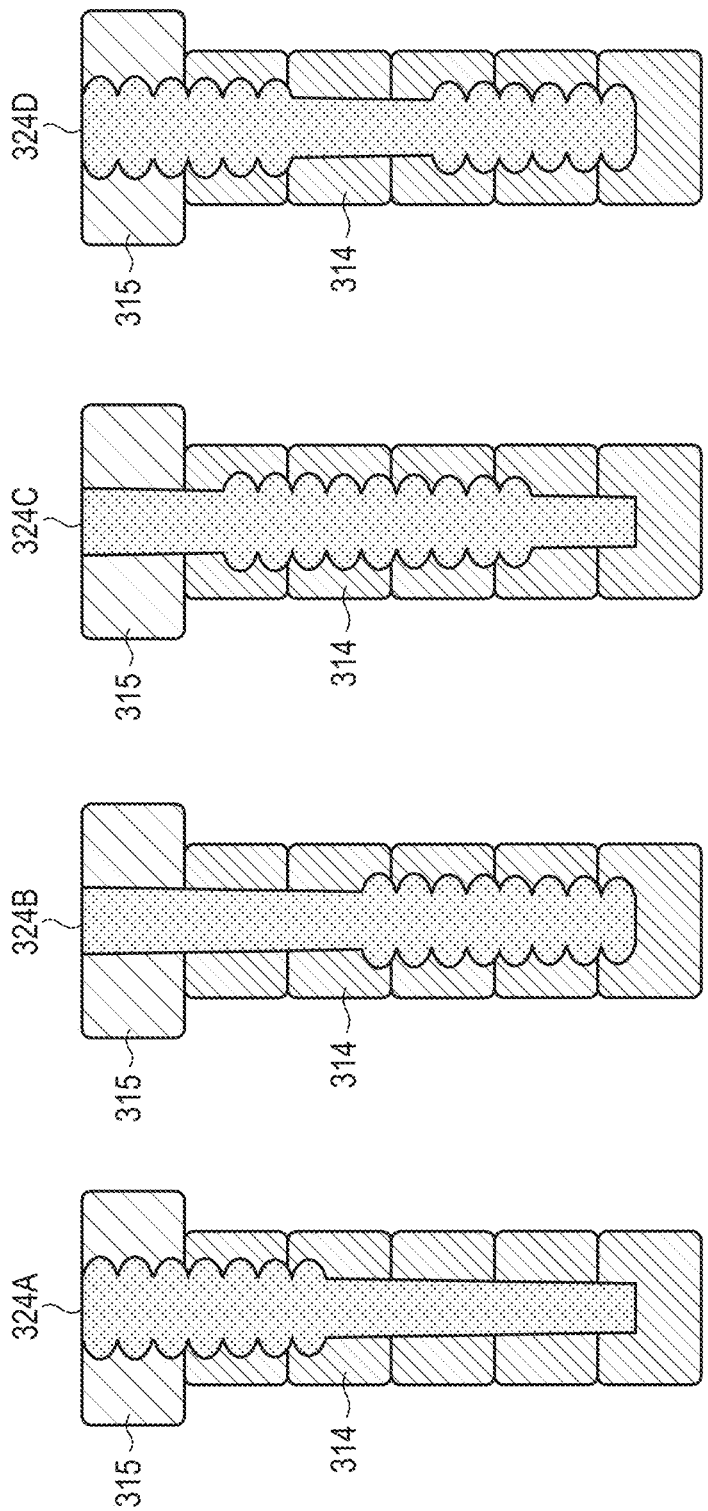

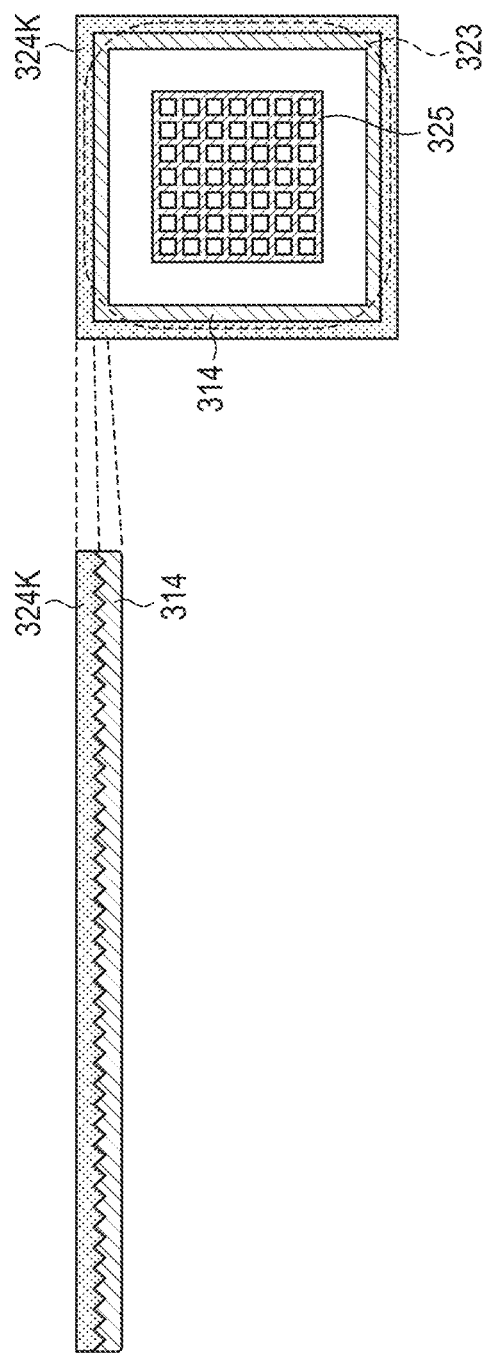
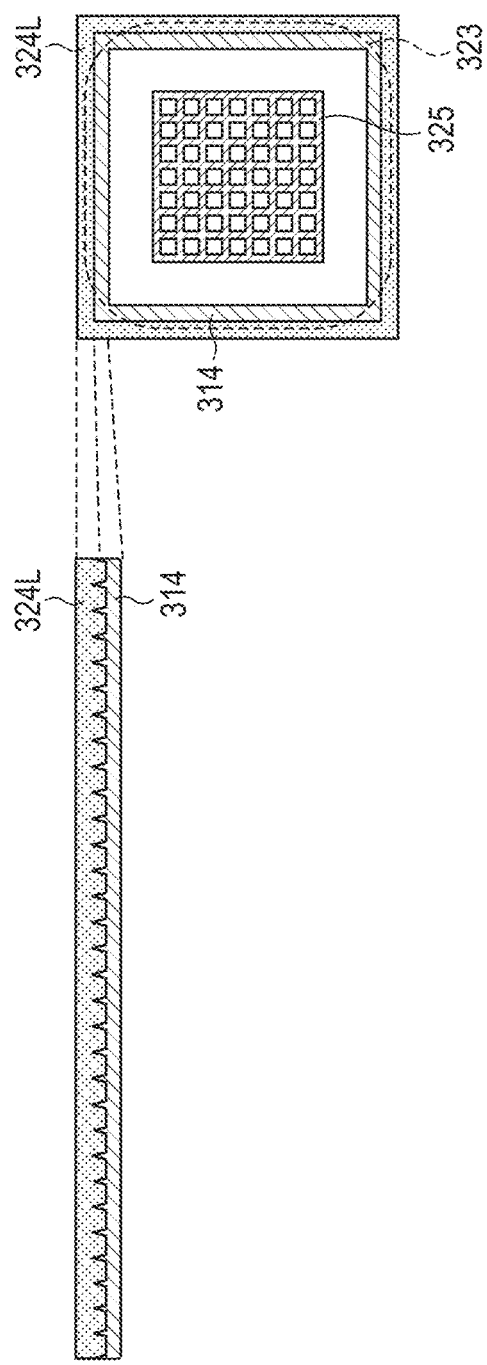

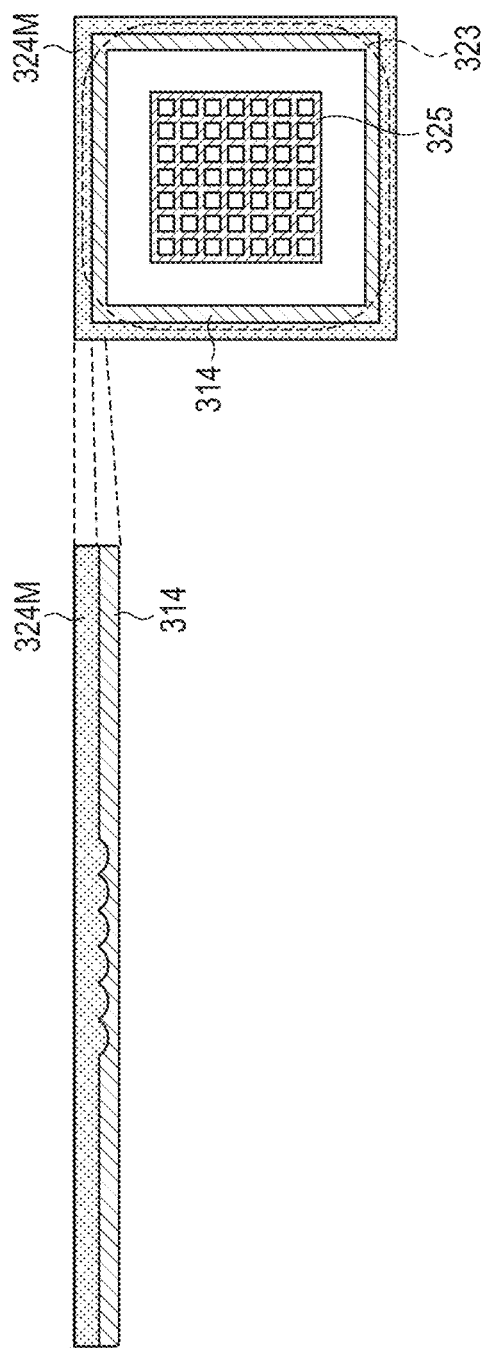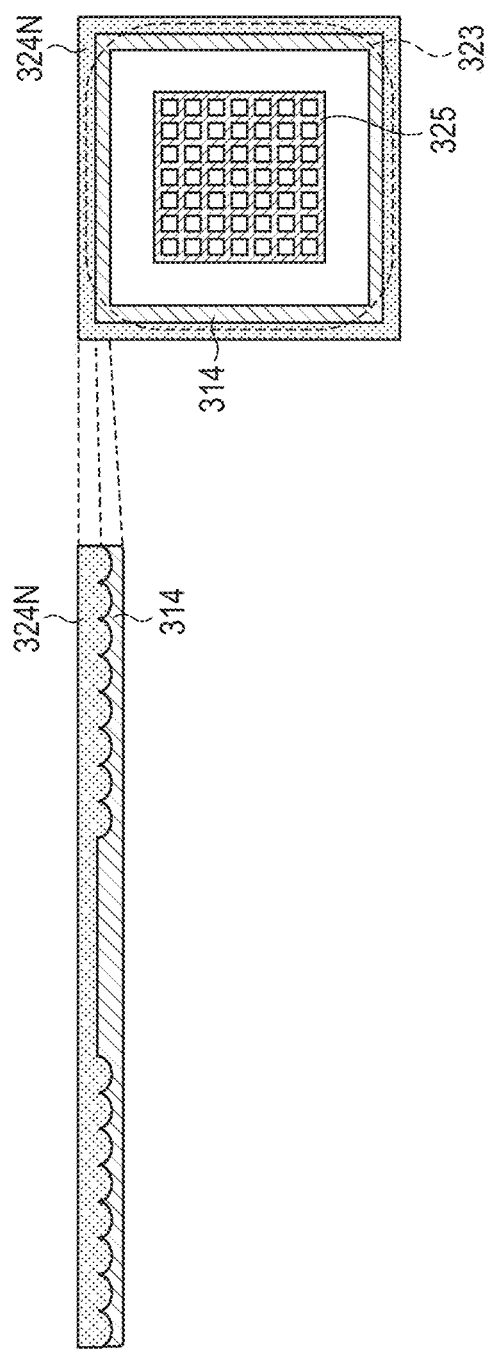

PHOTOELECTRIC CONVERSION DEVICE HAVING A SEMICONDUCTOR REGION ARRANGED IN A SUBSTRATE AND HAVING A PLURALITY OF REGIONS ALONG A SURFACE OF THE SUBSTRATE

BACKGROUND OF THE INVENTION

Field of the Invention

The present disclosure relates to a photoelectric conversion device.

Description of the Related Art

International Publication No. WO2018/139279 discloses a solid-state imaging element including an inter-pixel isolation portion having a protruding portion protruding toward a photoelectric conversion unit. International Publication No. WO2018/139279 further discloses a deep trench isolation (DTI) as an example of the inter-pixel isolation portion.

However, the DTI disclosed in International Publication No. WO2018/139279 may not necessarily be optimal in terms of sensitivity of incident light.

SUMMARY OF THE INVENTION

An object of the present disclosure is to provide a photoelectric conversion device capable of further improving sensitivity.

According to an aspect of the present disclosure, there is provided a photoelectric conversion device including a substrate, a photoelectric conversion unit arranged in the substrate and configured to generate charges corresponding to incident light, and a pixel isolation portion arranged in the substrate and isolating the photoelectric conversion unit from other elements. A sidewall of the pixel isolation portion has a plurality of depressions and protrusions in a cross-sectional view. A period of at least a part of the plurality of depressions and protrusions is greater than ½ of a wavelength of light to which the photoelectric conversion unit has sensitivity.

Further features of the present invention will become apparent from the following description of exemplary embodiments with reference to the attached drawings.

BRIEF DESCRIPTION OF THE DRAWINGS

FIGS. 8A, 8B, 8C, and 8D are schematic cross-sectional views of pixel isolation portions according to modified examples of the first embodiment.

FIGS. 15A and 15B are schematic plan views of avalanche photodiodes according to modified examples of the second embodiment.

FIGS. 16A and 16B are schematic plan views of avalanche photodiodes according to modified examples of the second embodiment.

DESCRIPTION OF THE EMBODIMENTS

Figure 1:
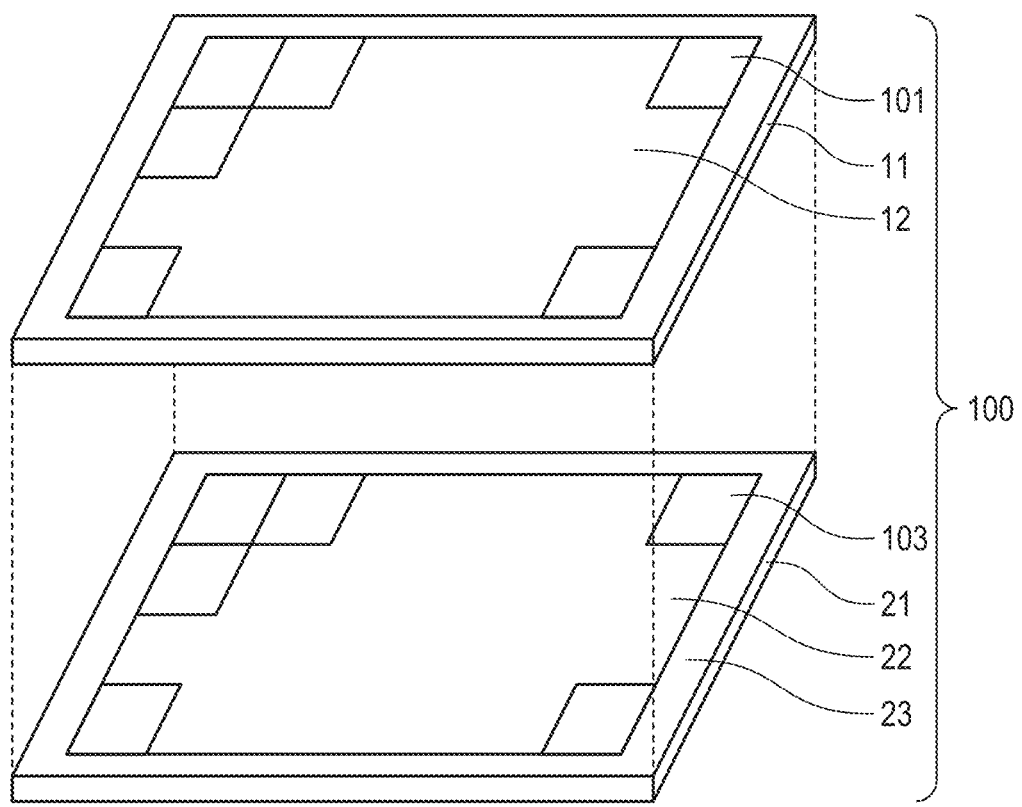
FIG. 1 is a schematic view illustrating an overall configuration of a photoelectric conversion device according to a first embodiment.

Preferred embodiments of the present invention will now be described in detail in accordance with the accompanying drawings. The following embodiments are intended to embody the technical idea of the present invention and do not limit the present invention. The sizes and positional relationships of the members illustrated in the drawings may be exaggerated for clarity of explanation. In the drawings, the same or corresponding elements are denoted by the same reference numerals, and the description thereof may be omitted or simplified.

In the following description, terms indicating specific directions or positions (for example, "upper", "lower", "right", "left" and other terms including those) are used as necessary. The use of these terms is intended to facilitate understanding of the embodiments with reference to the drawings, and the scope of the present invention is not limited by the meaning of those terms.

First Embodiment

FIG. 1 is a schematic view illustrating an overall configuration of a photoelectric conversion device 100 according to the present embodiment. The photoelectric conversion device 100 may be, for example, a solid-state imaging device, a focus detection device, a distance measuring device, a time-of-flight (TOF) camera, or the like. The photoelectric conversion device 100 includes a sensor substrate 11 (first substrate) and a circuit substrate 21 (second substrate) stacked on each other. The sensor substrate 11 and the circuit substrate 21 are electrically connected to each other. The sensor substrate 11 has a pixel region 12 in which a plurality of pixels 101 is arranged to form a plurality of rows and a plurality of columns. The circuit substrate 21 includes a first circuit region 22 in which a plurality of pixel signal processing units 103 is arranged to form a plurality of rows and a plurality of columns, and a second circuit region 23 arranged in the outer periphery of the first circuit region 22. The second circuit region 23 may include a circuit for controlling the plurality of pixel signal processing units 103. The sensor substrate 11 has a light incident surface that receives incident light and a connection surface opposed to the light incident surface. The sensor substrate 11 is connected to the circuit substrate 21 on the connection surface side. That is, the photoelectric conversion device 100 is a so-called backside illumination type.

In this specification, a term "plan view" refers to a view from a direction perpendicular to a surface opposite to the light incident surface. A cross section indicates a surface in a direction perpendicular to a surface opposite to the light incident surface of the sensor substrate 11. Although the light incident surface may be a rough surface when viewed microscopically, in this case, a plan view is defined with reference to the light incident surface when viewed macroscopically.

In the following description, the sensor substrate 11 and the circuit substrate 21 are diced chips, but the sensor substrate 11 and the circuit substrate 21 are not limited to chips. For example, the sensor substrate 11 and the circuit substrate 21 may be wafers. When the sensor substrate 11 and the circuit substrate 21 are diced chips, the photoelectric conversion device 100 may be manufactured by dicing after being stacked in a wafer state, or may be manufactured by stacking after being diced.

Figure 2:
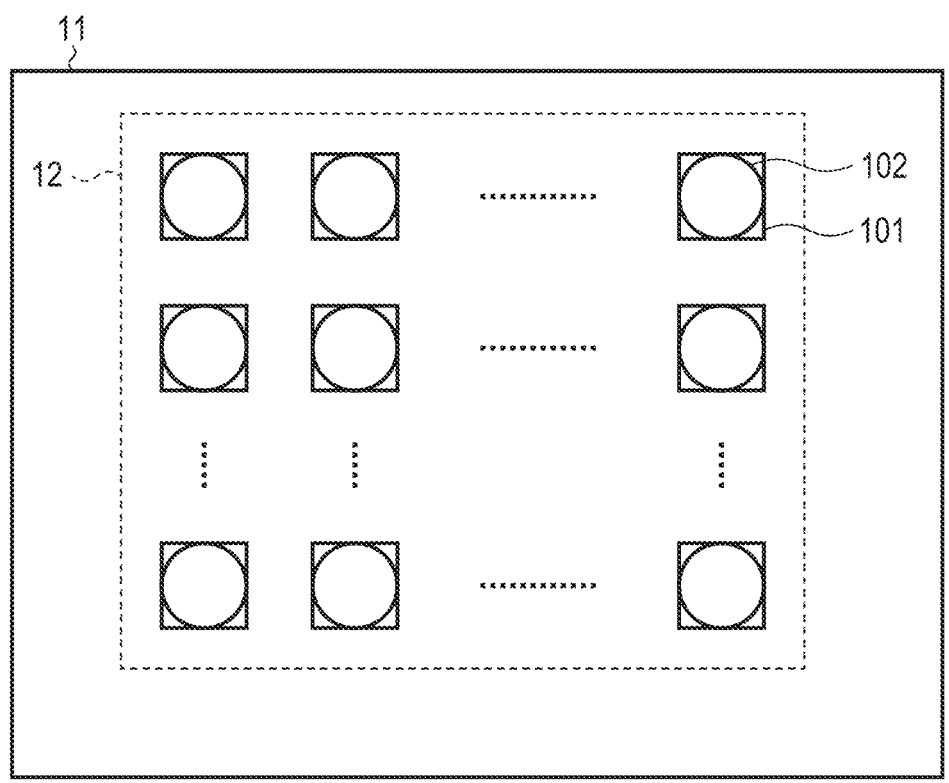
FIG. 2 is a schematic block diagram illustrating a configuration example of a sensor substrate according to the first embodiment.

FIG. 2 is a schematic block diagram illustrating an arrangement example of the sensor substrate 11. In the pixel region 12, a plurality of pixels 101 is arranged to form a plurality of rows and a plurality of columns. Each of the plurality of pixels 101 includes a photoelectric conversion unit 102 including an avalanche photodiode (hereinafter referred to as APD) as a photoelectric conversion element. When the photoelectric conversion device 100 is an imaging device, the plurality of pixels 101 may be elements that generate signals for an image by photoelectric conversion. However, in the case where the photoelectric conversion device 100 is a distance measuring device using a technology such as TOF, the pixel 101 may be an element for measuring time at which light arrives and amount of light. That is, the application of the plurality of pixels 101 is not limited to the acquisition of an image.

Of the charge pairs generated in the APD, a conductivity type of the charge used as the signal charge is referred to as a first conductivity type. The first conductivity type refers to a conductivity type in which a charge having the same polarity as the signal charge is used as a majority carrier. Further, a conductivity type opposite to the first conductivity type, that is, a conductivity type in which majority carriers are charges having a polarity different from that of signal charges is referred to as a second conductivity type. In the APD described below, the anode of the APD is set to a fixed potential, and a signal is extracted from the cathode of the APD. Accordingly, the semiconductor region of the first conductivity type is an N-type semiconductor region, and the semiconductor region of the second conductivity type is a P-type semiconductor region. Note that the cathode of the APD may have a fixed potential and a signal may be extracted from the anode of the APD. In this case, the semiconductor region of the first conductivity type is a P-type semiconductor region, and the semiconductor region of the second conductivity type is an N-type semiconductor region. Although the case where one node of the APD is set to a fixed potential is described below, potentials of both nodes may be varied.

In this specification, when a term "impurity concentration" is used, it means a net impurity concentration obtained by subtracting the amount compensated by the impurity of the opposite conductivity type. That is, the "impurity concentration" refers to the net doping concentration. A region where the added impurity concentration of the P-type is higher than the added impurity concentration of the N-type is a P-type semiconductor region. Conversely, a region where the added impurity concentration of the N-type is higher than the added impurity concentration of the P-type is an N-type semiconductor region.

Figure 3:
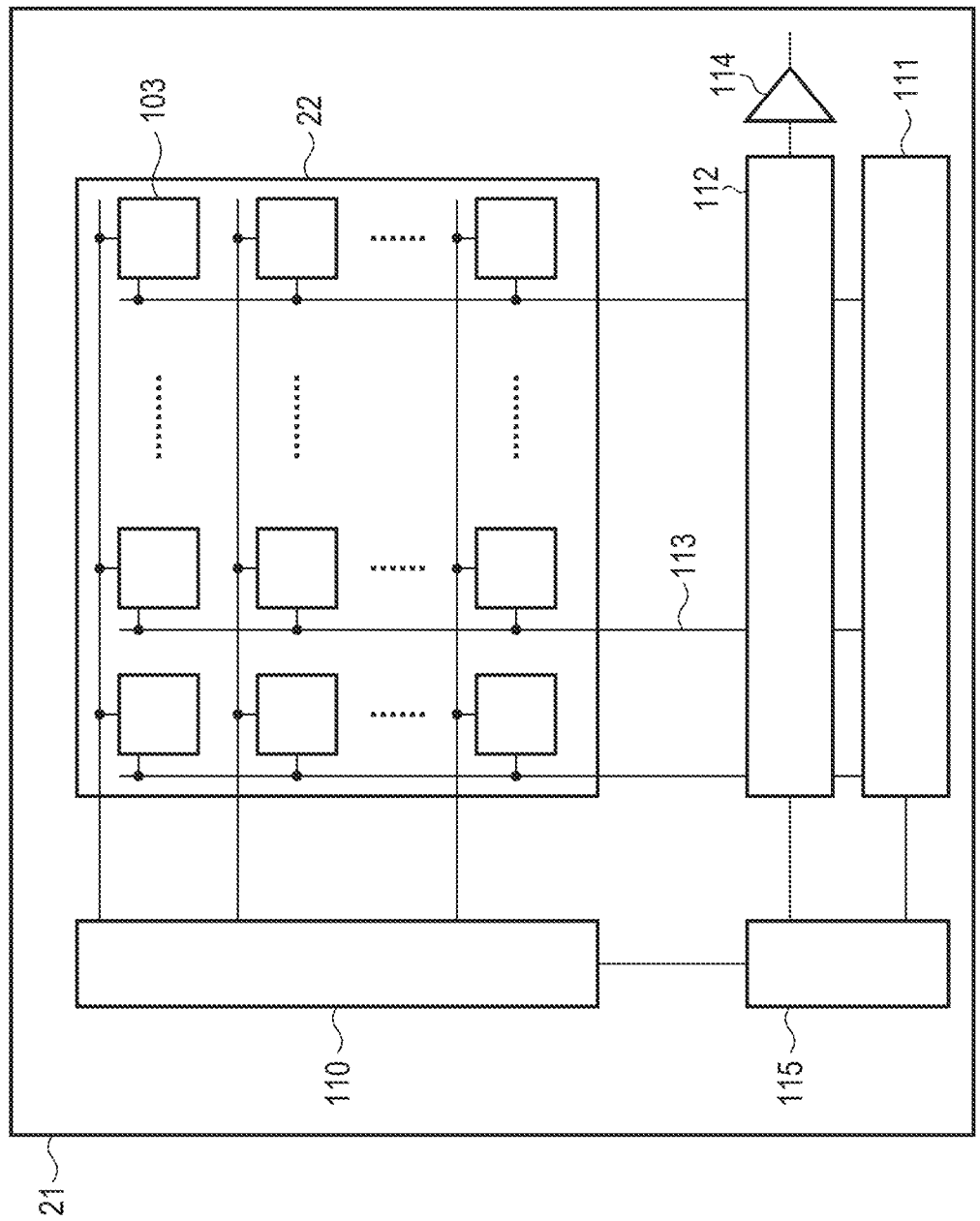
FIG. 3 is a schematic block diagram illustrating a configuration example of a circuit substrate according to the first embodiment.

FIG. 3 is a schematic block diagram illustrating a configuration example of the circuit substrate 21. The circuit substrate 21 has a first circuit region 22 in which a plurality of pixel signal processing units 103 is arranged to form a plurality of rows and a plurality of columns.

The circuit substrate 21 includes a vertical scanning circuit 110, a horizontal scanning circuit 111, a reading circuit 112, pixel output signal lines 113, an output circuit 114, and a control signal generation unit 115. The plurality of photoelectric conversion units 102 illustrated in FIG. 2 and the plurality of pixel signal processing units 103 illustrated in FIG. 3 are electrically connected to each other via connection wirings provided for each pixel 101.

The control signal generation unit 115 is a control circuit that generates control signals for driving the vertical scanning circuit 110, the horizontal scanning circuit 111, and the reading circuit 112, and supplies the control signals to these units. As a result, the control signal generation unit 115 controls the driving timing and the like of each unit.

The vertical scanning circuit 110 supplies control signals to each of the plurality of pixel signal processing units 103 based on the control signal supplied from the control signal generation unit 115. The vertical scanning circuit 110 supplies control signals for each row to each pixel signal processing unit 103 via driving lines provided for each row of the first circuit region 22. As will be described later, a plurality of driving lines may be provided for each row. A logic circuit such as a shift register or an address decoder can be used for the vertical scanning circuit 110. Thus, the vertical scanning circuit 110 selects a row to be output from the pixel signal processing unit 103.

A signal output from the photoelectric conversion unit 102 of the pixel 101 is processed by the pixel signal processing unit 103. The pixel signal processing unit 103 acquires and holds a digital signal having a plurality of bits by counting the number of pulses output from the APD included in the photoelectric conversion unit 102.

The pixel signal processing unit 103 need not necessarily be provided for each pixel 101. For example, one pixel signal processing unit 103 may be shared by a plurality of pixels 101. In this case, the pixel signal processing unit 103 sequentially processes the signals output from the photoelectric conversion units 102, thereby providing a function of signal processing to each pixel 101.

The horizontal scanning circuit 111 supplies a control signal to the reading circuit 112 based on the control signal supplied from the control signal generation unit 115. The pixel signal processing unit 103 is connected to the reading circuit 112 via a pixel output signal line 113 provided for each column of the first circuit region 22. The pixel output signal line 113 in one column is shared by a plurality of pixel signal processing units 103 in the corresponding column. The pixel output signal line 113 includes a plurality of wirings, and has at least a function of outputting a digital signal from the pixel signal processing unit 103 to the reading circuit 112, and a function of supplying a control signal for selecting a column for outputting a signal to the pixel signal processing unit 103. The reading circuit 112 outputs a signal to a storage unit or a signal processing unit arranged outside of the photoelectric conversion device 100 via the output circuit 114 based on the control signal supplied from the control signal generation unit 115.

The photoelectric conversion units 102 in the pixel region 12 may be one-dimensionally arranged. The pixel signal processing unit 103 does not necessarily have to be provided for each pixel 101. For example, one pixel signal processing unit 103 may be shared by a plurality of pixels 101. In this case, the pixel signal processing unit 103 sequentially processes the signals output from the photoelectric conversion units 102, thereby providing a function of signal processing to each pixel 101.

As illustrated in FIGS. 2 and 3, a first circuit region 22 in which a plurality of pixel signal processing units 103 are arranged is arranged in a region overlapping the pixel region 12 in a plan view. In the plan view, the vertical scanning circuit 110, the horizontal scanning circuit 111, the reading circuit 112, the output circuit 114, and the control signal generation unit 115 are arranged so as to overlap a region between the edge of the sensor substrate 11 and the edge of the pixel region 12. In other words, the sensor substrate 11 includes the pixel region 12 and a non-pixel region arranged around the pixel region 12. In the circuit substrate 21, the second circuit region 23 having the vertical scanning circuit 110, the horizontal scanning circuit 111, the reading circuit 112, the output circuit 114, and the control signal generation unit 115 is arranged in a region overlapping with the non-pixel region in the plan view.

Note that the arrangement of the pixel output signal line 113, the arrangement of the reading circuit 112, and the arrangement of the output circuit 114 are not limited to those illustrated in FIG. 3. For example, the pixel output signal lines 113 may extend in the row direction, and may be shared by a plurality of pixel signal processing units 103 in corresponding rows. The reading circuit 112 may be provided so as to be connected to the pixel output signal line 113 of each row.

Figure 4:
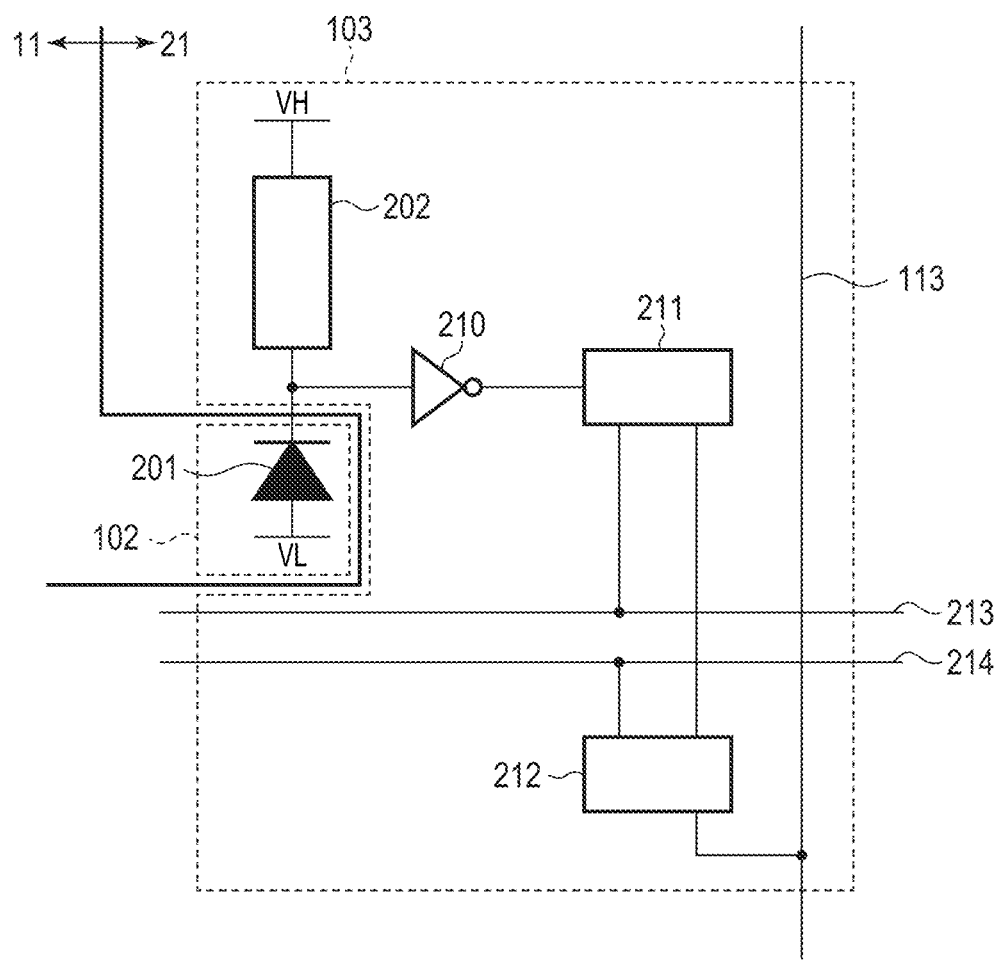
FIG. 4 is a schematic block diagram illustrating a configuration example of a photoelectric conversion unit and a pixel signal processing unit in one pixel according to the first embodiment.

FIG. 4 is a schematic block diagram illustrating a configuration example of the photoelectric conversion unit 102 and the pixel signal processing unit 103 in one pixel according to the present embodiment. FIG. 4 schematically illustrates a more specific configuration example including a connection relationship between the photoelectric conversion unit 102 arranged in the sensor substrate 11 and the pixel signal processing unit 103 arranged in the circuit substrate 21. In FIG. 4, driving lines between the vertical scanning circuit 110 and the pixel signal processing unit 103 in FIG. 3 are illustrated as driving lines 213 and 214.

The photoelectric conversion unit 102 includes an APD 201. The pixel signal processing unit 103 includes a quenching element 202, a waveform shaping unit 210, a counter circuit 211, and a selection circuit 212. The pixel signal processing unit 103 may include at least one of the waveform shaping unit 210, the counter circuit 211, and the selection circuit 212.

The APD 201 generates charge pairs corresponding to incident light by photoelectric conversion. A voltage VL (first voltage) is supplied to the anode of the APD 201. The cathode of the APD 201 is connected to a first terminal of the quenching element 202 and an input terminal of the waveform shaping unit 210. A voltage VH (second voltage) higher than the voltage VL supplied to the anode is supplied to the cathode of the APD 201. As a result, a reverse bias voltage that causes the APD 201 to perform the avalanche multiplication operation is supplied to the anode and the cathode of the APD 201. In the APD 201 to which the reverse bias voltage is supplied, when a charge is generated by the incident light, this charge causes avalanche multiplication, and an avalanche current is generated.

Operation modes in the case where a reverse bias voltage is supplied to the APD 201 include a Geiger mode and a linear mode. The Geiger mode is a mode in which a potential difference between the anode and the cathode is higher than a breakdown voltage, and the linear mode is a mode in which a potential difference between the anode and the cathode is near or lower than the breakdown voltage.

The APD operated in the Geiger mode is referred to as a single photon avalanche diode (SPAD). In this case, the voltage VL (first voltage) is −30 V and the voltage VH (second voltage) is 1 V, for example. The APD 201 may operate in the linear mode or the Geiger mode. In the case of SPAD, a potential difference is greater than that of APD operating in the linear mode, and the effect of avalanche multiplication is significant, and thus SPAD is preferably employed.

The quenching element 202 functions as a load circuit (quenching circuit) when a signal is multiplied by avalanche multiplication. The quenching element 202 suppresses the voltage supplied to the APD 201 and suppresses the avalanche multiplication (quenching operation). Further, the quenching element 202 returns the voltage supplied to the APD 201 to the voltage VH by passing a current corresponding to the voltage drop due to the quenching operation (recharge operation). The quenching element 202 may be, for example, a resistive element.

The waveform shaping unit 210 is a circuit that shapes the potential change of the cathode of the APD 201 obtained at the time of photon detection and outputs a pulse signal. For example, an inverter circuit is used for the waveform shaping unit 210. Although FIG. 4 illustrates an example in which one inverter is used as the waveform shaping unit 210, the waveform shaping unit 210 may be a circuit in which a plurality of inverters is connected in series, or may be another circuit having a waveform shaping effect.

The counter circuit 211 counts the number of pulses output from the waveform shaping unit 210, and holds a digital signal indicating the count value. When a control signal is supplied from the vertical scanning circuit 110 through the driving line 213, the counter circuit 211 resets the held signal.

The selection circuit 212 is supplied with a control signal from the vertical scanning circuit 110 illustrated in FIG. 3 through the driving line 214 illustrated in FIG. 4. In response to this control signal, the selection circuit 212 switches the electrical connection or the electrical disconnection between the counter circuit 211 and the pixel output signal line 113.

The selection circuit 212 includes, for example, a buffer circuit for outputting a signal corresponding to a value held in the counter circuit 211.

In the example of FIG. 4, the selection circuit 212 switches the electrical connection or the disconnection of the counter circuit 211 and the pixel output signal line 113; however, the method of controlling the signal output to the pixel output signal line 113 is not limited thereto. For example, a switch such as a transistor may be arranged at a node such as between the quenching element 202 and the APD 201 or between the photoelectric conversion unit 102 and the pixel signal processing unit 103, and the signal output to the pixel output signal line 113 may be controlled by switching the electrical connection or the disconnection. Alternatively, the signal output to the pixel output signal line 113 may be controlled by changing the value of the voltage VH or the voltage VL supplied to the photoelectric conversion unit 102 using a switch such as a transistor.

FIG. 4 illustrates a configuration example using the counter circuit 211. However, instead of the counter circuit 211, a time-to-digital conversion circuit (time-to-digital converter, hereinafter referred to as TDC) and a memory may be used to acquire a timing at which a pulse is detected. In this case, the generation timing of the pulse signal output from the waveform shaping unit 210 is converted into a digital signal by the TDC. In this case, a control signal (reference signal) may be supplied from the vertical scanning circuit 110 illustrated in FIG. 3 to the TDC via the driving line. The TDC acquires, as a digital signal, a signal indicating a relative time of a pulse input timing based on the control signal.

Figure 5A:
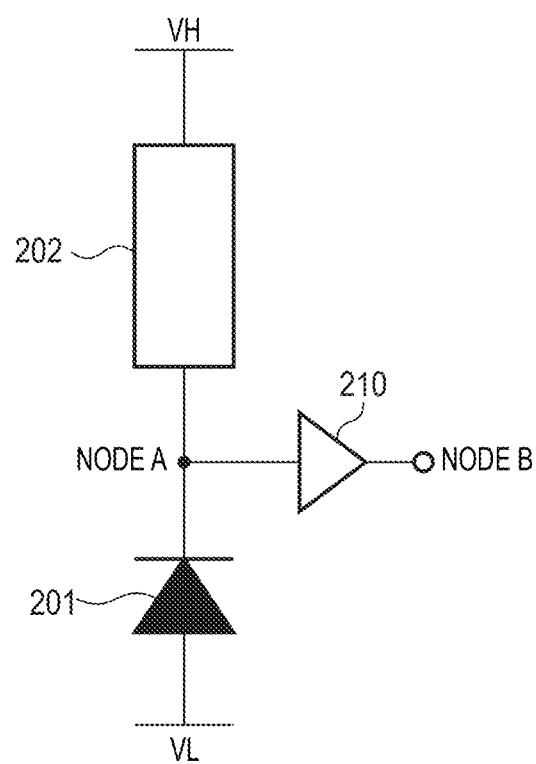
FIGS. 5A, 5B, and 5C are diagrams illustrating an operation of an avalanche photodiode according to the first embodiment.
Figure 5B:
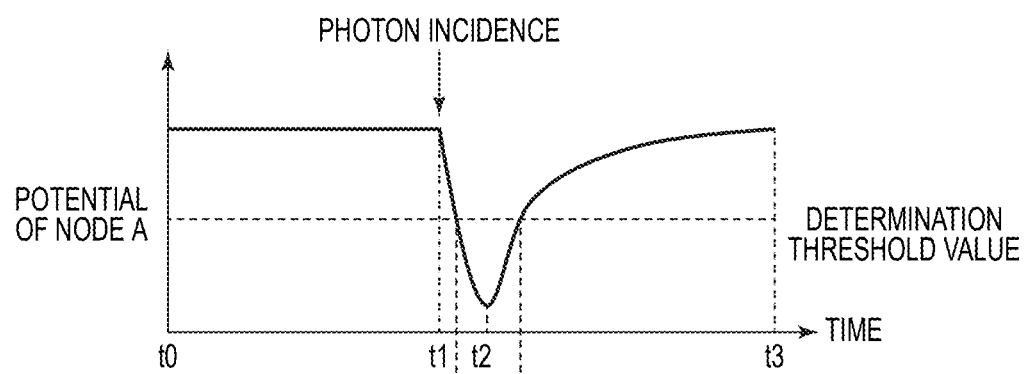
Figure 5C:
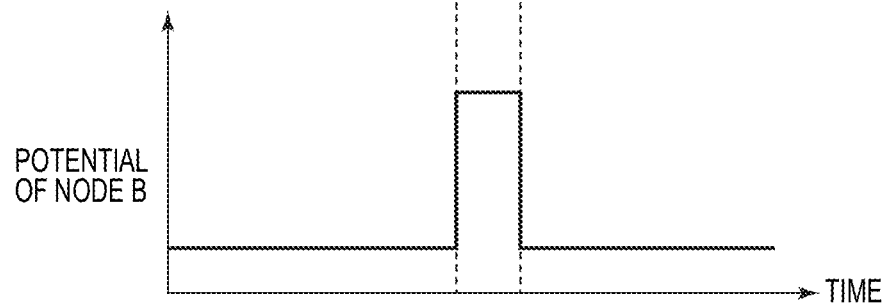

FIGS. 5A, 5B, and 5C are diagrams illustrating the operation of the APD 201 according to the present embodiment. FIG. 5A is a diagram illustrating the APD 201, the quenching element 202, and the waveform shaping unit 210 in FIG. 4. As illustrated in FIG. 5A, the connection node of the APD 201, the quenching element 202, and the input terminal of the waveform shaping unit 210 is referred to as a node A. Further, as illustrated in FIG. 5A, the output side of the waveform shaping unit 210 is referred to as a node B.

FIG. 5B is a graph illustrating a temporal change in a potential of the node A in FIG. 5A. FIG. 5C is a graph illustrating a temporal change in a potential of the node B in FIG. 5A. During a period from time t0 to time t1, the voltage VH-VL is applied to the APD 201 in FIG. 5A. When a photon enters the APD 201 at the time t1, avalanche multiplication occurs in the APD 201. As a result, an avalanche current flows through the quenching element 202, and the potential of the node A drops. Thereafter, the potential drop amount further increases, and the voltage applied to the APD 201 gradually decreases. Then, at time t2, the avalanche multiplication in the APD 201 stops. Thereby, the voltage level of the node A does not drop below a certain constant value. Then, during a period from the time t2 to time t3, a current that compensates for the voltage drop flows from the node of the voltage VH to the node A, and the node A is settled to the original potential at the time t3.

In the above-described process, the potential of the node B becomes high level in a period in which the potential of the node A is lower than a certain threshold value. In this way, the waveform of the drop of the potential of the node A caused by the incidence of the photon is shaped by the waveform shaping unit 210 and output as a pulse to the node B.

Figure 6A:
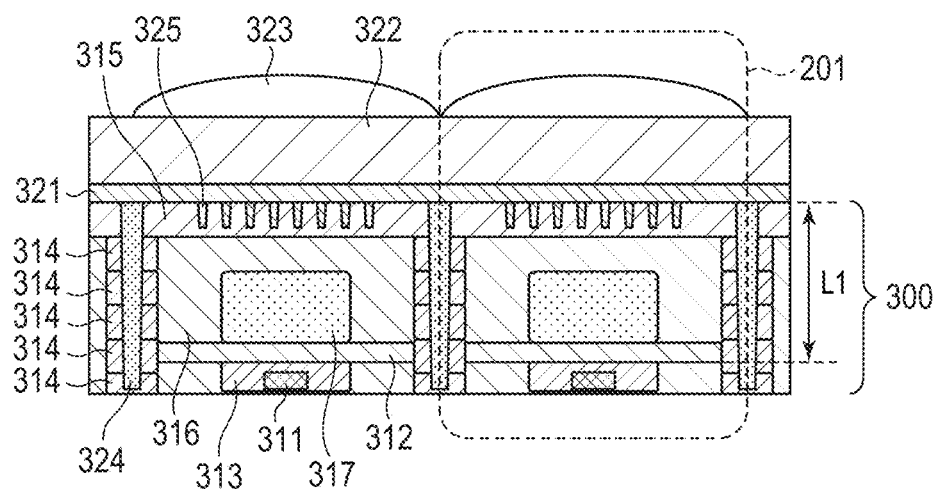
FIGS. 6A, 6B, and 6C are diagrams illustrating a structure of the avalanche photodiode according to the first embodiment.
Figure 6B:
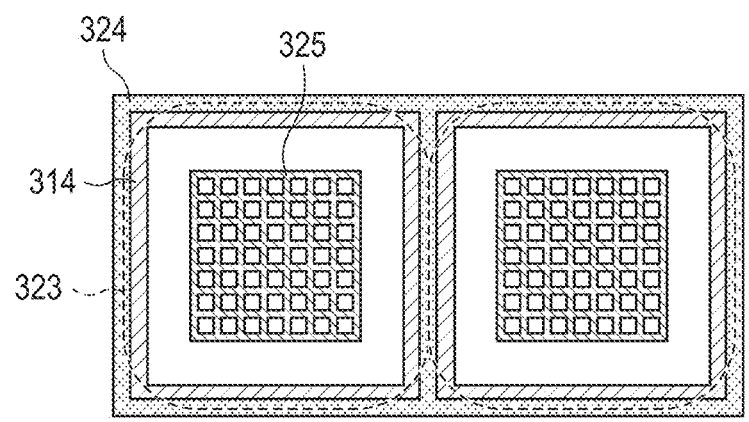
Figure 6C:
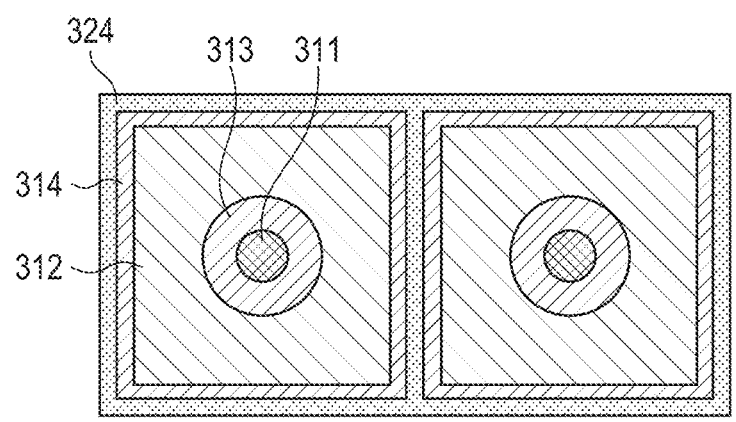

FIGS. 6A, 6B, and 6C are diagrams illustrating a structure of the APD 201 according to the present embodiment. FIG. 6A is a schematic cross-sectional view of the APD 201. FIG. 6B is a schematic plan view illustrating a structure in the vicinity of the light incident surface of a semiconductor layer 300. FIG. 6C is a schematic plan view illustrating a structure of the semiconductor layer 300 in the vicinity of an avalanche multiplication region. The structure of the APD 201 will be described with reference to FIGS. 6A, 6B, and 6C.

A plurality of semiconductor regions constituting the APD 201 are arranged in the semiconductor layer 300 of the sensor substrate 11. The semiconductor layer 300 has a first surface on which light is incident and a second surface which is a surface opposite to the first surface. In this specification, a depth direction is a direction from the first surface to the second surface of the semiconductor layer 300 on which the APD 201 is arranged. Hereinafter, the "first surface" may be referred to as a "back surface" and the "second surface" may be referred to as a "front surface". A direction from a predetermined position of the semiconductor layer 300 toward the front surface of the semiconductor layer 300 may be referred to as "deep". A direction from a predetermined position of the semiconductor layer 300 toward the back surface of the semiconductor layer 300 may be referred to as "shallow".

The semiconductor layer 300 includes a first semiconductor region 311, a second semiconductor region 312, a third semiconductor region 313, a fourth semiconductor region 314, a fifth semiconductor region 315, a sixth semiconductor region 316, a seventh semiconductor region 317, and a pixel isolation portion 324. The APD 201 includes at least the first semiconductor region 311 of the first conductivity type and the second semiconductor region 312 of the second conductivity type. The first semiconductor region 311 and the second semiconductor region 312 form a PN junction. The impurity concentration of the first semiconductor region 311 is higher than the impurity concentration of the second semiconductor region 312. A predetermined reverse bias voltage is applied to the first semiconductor region 311 and the second semiconductor region 312, thereby forming an avalanche multiplication region.

As illustrated in FIG. 6A, the third semiconductor region 313 of the first conductivity type may be arranged between the first semiconductor region 311 and the second semiconductor region 312 in the depth direction. As illustrated in FIG. 6C, the first semiconductor region 311 may be circular in the plan view. The third semiconductor region 313 may have a concentric shape surrounding the first semiconductor region 311 in the plan view.

As illustrated in FIG. 6A, the fifth semiconductor region 315 of the second conductivity type is arranged at a position shallower than the second semiconductor region 312. The fifth semiconductor region 315 is arranged in contact with the fourth semiconductor region 314 of the second conductivity type. As illustrated in FIGS. 6B and 6C, in the plan view, the fourth semiconductor region 314 is arranged so as to surround the first semiconductor region 311, the second semiconductor region 312, and the third semiconductor region 313. As illustrated in FIGS. 6A, 6B, and 6C, the fifth semiconductor region 315 may be arranged in the entire region of the APD 201 in the plan view, and a part of the fifth semiconductor region 315 may overlap the fourth semiconductor region 314. The fourth semiconductor region 314 may be arranged over the entire depth of the semiconductor layer 300, and a part of the fourth semiconductor region 314 may be at the same depth as the fifth semiconductor region 315.

Between adjacent APDs 201 of the plurality of APDs 201 (pixels 101), a pixel isolation portion 324 having a structure in which an insulator (dielectric) is buried in the semiconductor layer 300 is arranged. As illustrated in FIGS. 6A, 6B and 6C, a deep trench isolation (DTI) structure in which insulator such as silicon oxide is buried in a deep trench may be used for the pixel isolation portion 324. Metal may be buried in the deep trench in addition to the insulator. Alternatively, a thin insulator layer may be formed on a sidewall of the deep trench, and metal may be buried in the deep trench and the insulator layer. The pixel isolation portion 324 has a rectangular shape (including a square shape) surrounding one APD 201 in the plan view. Thus, the pixel isolation portion 324 isolates one APD 201 from the other elements.

The seventh semiconductor region 317 of the first conductivity type is provided between the second semiconductor region 312 and the fifth semiconductor region 315. The impurity concentration of the seventh semiconductor region 317 is higher than the impurity concentration of the sixth semiconductor region 316 provided around the seventh semiconductor region 317. With this configuration, the potential of the seventh semiconductor region 317 is lower than the potential of the sixth semiconductor region 316 with respect to the signal charge, and more charges can be collected in the avalanche multiplication region. The seventh semiconductor region 317 is a semiconductor region provided if necessary, and may not be provided. Although part of the seventh semiconductor region 317 and the second semiconductor region 312 are in contact with each other in FIG. 6A, the seventh semiconductor region 317 may be provided apart from the second semiconductor region 312.

A pinning film 321, a planarization layer 322, and a microlens 323 are arranged on the incident surface side of the semiconductor layer 300. Further, an antireflection film for preventing reflection of incident light may be further arranged on the incident surface side of the semiconductor layer 300. Further, a color filter may be further provided between the microlens 323 and the semiconductor layer 300.

Figure 7:
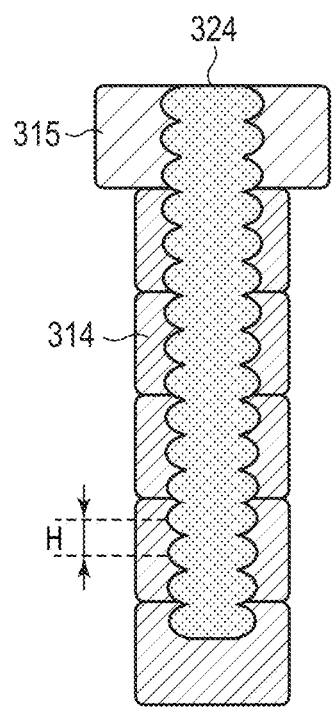
FIG. 7 is a schematic cross-sectional view of a pixel isolation portion according to the first embodiment.

FIG. 7 is a schematic cross-sectional view of the pixel isolation portion according to the present embodiment. FIG. 7 illustrates the pixel isolation portion 324, the fourth semiconductor region 314 and the fifth semiconductor region 315 in the vicinity of the pixel isolation portion 324 in FIGS. 6A, 6B, and 6C.

As illustrated in FIG. 7, in a cross-sectional view, the pixel isolation portion 324 is arranged inside the fourth semiconductor region 314 and the fifth semiconductor region 315 from the back surface side toward the depth direction of the sensor substrate 11. As illustrated in FIG. 7, the sidewall of the pixel isolation portion 324 has a plurality of depressions and protrusions arranged along the depth direction of the sensor substrate 11. The depressions and protrusions may be formed, for example, by appropriately setting process conditions when forming the pixel isolation portion 324 using a Bosch process or the like.

Here, the relationship between the period of the depressions and protrusions arranged on the sidewall of the pixel isolation portion 324 and the sensitivity of the APD 201 will be described. In order to sufficiently photoelectrically convert the light incident on the APD 201, it is necessary to propagate the light in the semiconductor layer 300 at a sufficient distance (hereinafter referred to as an optical path length). Therefore, in order to improve the efficiency of photoelectric conversion, it is required to secure a sufficient thickness of the semiconductor layer 300. The optical path length required for improving the efficiency of photoelectric conversion is short in the case of light having a relatively short wavelength such as blue light, and long in the case of light having a relatively long wavelength such as red light or near infrared light. Therefore, when the APD 201 is sensitive to red light or near infrared light, the semiconductor layer 300 is required to be thicker than when the APD 201 is sensitive to blue light.

A specific example of the thickness of the semiconductor layer 300 in the case where the APD 201 is arranged in a single crystal silicon substrate will be described. When the depth L1 of the photoelectric conversion region illustrated in FIG. 6A is about 4 μm, 99% or more of the incident light is photoelectrically converted with respect to the blue light or the green light among the light in the visible region. However, for red light or near-infrared light, it is necessary to further increase the thickness of the photoelectric conversion region in order to photoelectrically convert 99% or more of incident light. In general, since the depth of the photoelectric conversion region of the APD 201 is about several μm, the efficiency of photoelectric conversion may not be sufficient particularly for light having a relatively long wavelength such as red light or near infrared light.

In the present embodiment, the depressions and protrusions is arranged on the sidewall of the pixel isolation portion 324, and a structure in which incident light can be diffusely reflected by the depressions and protrusions on the sidewall. The diffusely reflected light mainly propagates in the photoelectric conversion region. Therefore, since the optical path length of the light propagating in the semiconductor layer 300 is increased by the diffuse reflection, the efficiency of the photoelectric conversion can be improved.

In the interaction between incident light and the depressions and protrusions, there are cases where ray approximation in geometric optics can be applied and cases where it is necessary to consider properties as wave in wave optics. Under a condition in which ray approximation can be applied, when a point at which light enters is defined as a reflection surface, reflection occurs such that the incidence angle and the reflection angle with respect to the normal line on the reflection surface are equal to each other. In this case, since the reflection angle changes depending on the incident point in the depressions and protrusions, the incident light is diffusely reflected. On the other hand, under the condition in which the light ray approximation cannot be applied and it is necessary to consider the property as wave, the incident light is less susceptible to the depressions and protrusions due to diffraction. Therefore, the diffuse reflection hardly occurs under this condition. Whether or not the ray approximation is applicable is determined by a relationship between the wavelength of the incident light and a period H of the depressions and protrusions. When the period H of the depressions and protrusions is greater than ½ of the wavelength of the incident light, diffraction is less likely to occur, and since the ray approximation can be applied, diffuse reflection occurs sufficiently. Therefore, when the period H of the depressions and protrusions is greater than ½ of the wavelength of the incident light, the incident light is diffusely reflected in the depressions and protrusions, and the effect of increasing the optical path length in the semiconductor layer 300 can be sufficiently obtained. Thereby, the efficiency of photoelectric conversion can be improved.

As described above, according to the present embodiment, in the pixel isolation portion 324 formed by DTI, since the period H of the depressions and protrusions of the sidewall is greater than ½ of the wavelength of the incident light, the photoelectric conversion device capable of further improving the sensitivity is provided.

As an example, in the case where the APD 201 has sensitivity to red light (about 650 nm), the period H of the depressions and protrusions of the sidewall of the pixel isolation portion 324 is desirably greater than 325 nm which is ½ of 650 nm. In this case, a photoelectric conversion device capable of further improving sensitivity to red light is provided. When the period H is greater than 325 nm, a condition in which diffuse reflection occurs also for green light and blue light having shorter wavelengths than red light is satisfied. Therefore, under this condition, a photoelectric conversion device capable of further improving sensitivity to almost the entire visible light is provided. Since the depth L1 of the photoelectric conversion region in the substrate is about 4 μm as described above, the period H of the depressions and protrusions of the sidewall of the pixel isolation portion 324 is desirably less than 4 μm. When the period H is less than 4 μm, at least one set of depression and protrusion exists in the photoelectric conversion region, which is suitable for generation of diffuse reflection. As described above, the period H is preferably greater than 325 nm and less than 4 μm.

As illustrated in FIGS. 6A and 6B, it is more desirable that a depression/protrusion structure 325 be disposed at the light incident surface side of the semiconductor layer 300, that is, in the fifth semiconductor region 315. The depression/protrusion structure 325 has a lattice shape in the plan view and a trench shape in the cross-sectional view. Providing the depression/protrusion structure 325 increases the possibility that light is diffracted on the light incident surface of the APD 201 and light is incident on the sidewall, and therefore the optical path length may be further increased. Therefore, although not essential, it is more desirable to employ the depression/protrusion structure 325 in combination with the depressions and protrusions of the sidewall of the pixel isolation portion 324.

Hereinafter, modified examples of the present embodiment will be described. FIGS. 8A, 8B, 8C, and 8D are schematic cross-sectional views of pixel isolation portions according to modified examples of the present embodiment. FIGS. 8A, 8B, 8C, and 8D each illustrates an example in which depressions and protrusions of the sidewall of the pixel isolation portion is arranged in a part of the depth direction.

On a sidewall of a pixel isolation portion 324A illustrated in FIG. 8A, depressions and protrusions are arranged in the vicinity of the light incident surface. In this modified example, since the reflectance of long-wavelength light obliquely incident on the sidewall of the pixel isolation portion 324A is improved, the sensitivity of the APD 201 can be improved.

On a sidewall of a pixel isolation portion 324B illustrated in FIG. 8B, depressions and protrusions are arranged in the vicinity of the avalanche multiplication region. In this modified example, since the reflectance of photons generated by avalanche multiplication is improved, crosstalk to adjacent pixels can be reduced. As described above, it is desirable that the depressions and protrusions of the sidewall be arranged at least at a depth at which avalanche multiplication occurs in the APD 201, and an effect of reducing crosstalk to adjacent pixels is obtained.

As other modified examples, as in a pixel isolation portion 324C illustrated in FIG. 8C, depressions and protrusions may be arranged near the center of the sidewall in the depth direction, and as in a pixel isolation portion 324D illustrated in FIG. 8D, depressions and protrusions may be arranged at a plurality of positions of the sidewall.

Note that, in the pixel isolation portions 324A to 324D illustrated in FIGS. 8A to 8D, the sidewalls of the portions where the depressions and protrusions are not formed may be flat, or may have fine depressions and protrusions that do not cause the effect of diffuse reflection.

Figure 9A:
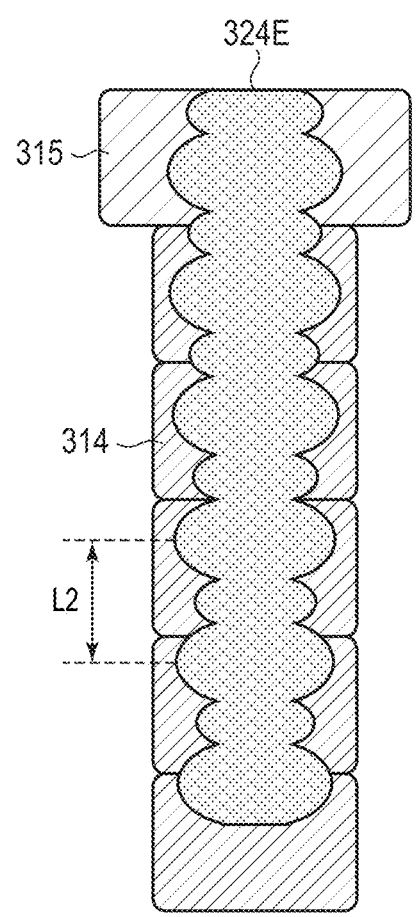
FIGS. 9A and 9B are schematic cross-sectional views of pixel isolation portions according to modified examples of the first embodiment.
Figure 9B:
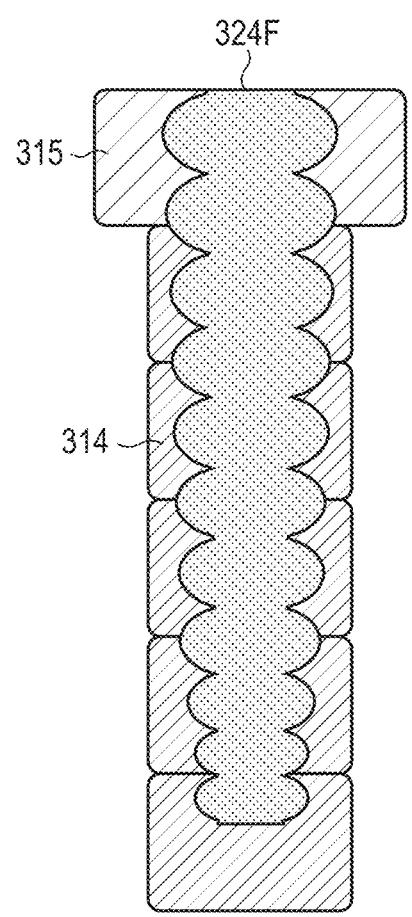

FIGS. 9A and 9B are schematic cross-sectional views of pixel isolation portions according to modified examples of the present embodiment. In each of sidewalls of pixel isolation portions of FIGS. 9A and 9B, relatively large depressions and protrusions and relatively small depressions and protrusions are arranged in combination.

On a sidewall of a pixel isolation portion 324E illustrated in FIG. 9A, relatively large depressions and protrusions and relatively small depressions and protrusions are alternately arranged in the depth direction. In this case, if a distance L2 between protrusions in the relatively large depressions and protrusions is greater than ½ of the wavelength of the incident light, the effect of increasing the optical path length in the semiconductor layer 300 can be sufficiently obtained.

In addition, on a sidewall of a pixel isolation portion 324F illustrated in FIG. 9B, the deeper the depressions and protrusions are arranged at, the smaller the depressions and protrusions are. Thus, the size of the depressions and protrusions may vary in the depth direction of the sidewall.

Figure 10:
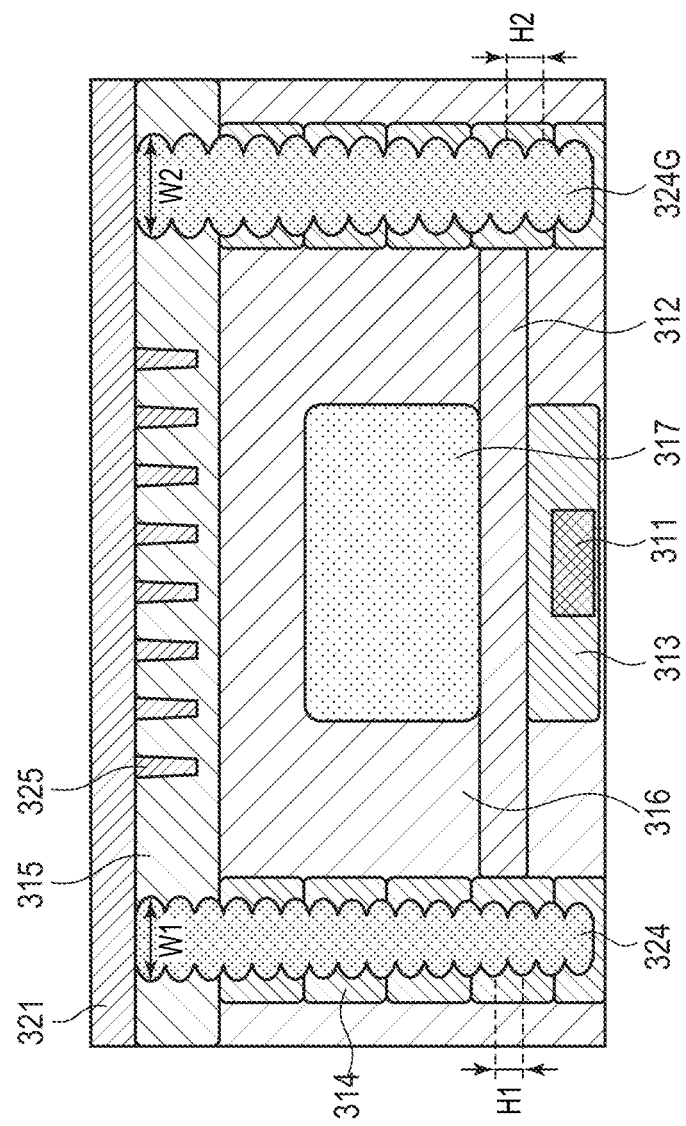
FIG. 10 is a schematic cross-sectional view of an avalanche photodiode according to a modified example of the first embodiment.

In each of the following FIGS. 10 to 13, a cross section of one APD 201 is extracted and illustrated, and the planarization layer 322 and the microlens 323 are not illustrated. FIG. 10 is a schematic cross-sectional view of an APD 201 according to a modified example of the present embodiment. FIG. 10 illustrates a pixel isolation portion 324 arranged at the left side of the APD 201 and a pixel isolation portion 324G arrange at the right side of the APD 201. The pixel isolation portion 324 and the pixel isolation portion 324G have different shapes from each other. More specifically, a width W1 of the pixel isolation portion 324 and a width W2 of the pixel isolation portion 324G are different from each other, and further, a period H1 of the depressions and protrusions of the pixel isolation portion 324 and a period H2 of the depressions and protrusions of the pixel isolation portion 324G are different from each other. As described above, a plurality of types of pixel isolation portions having different shapes such as the width and period of the depressions and protrusions may be combined and used.

Figure 11:
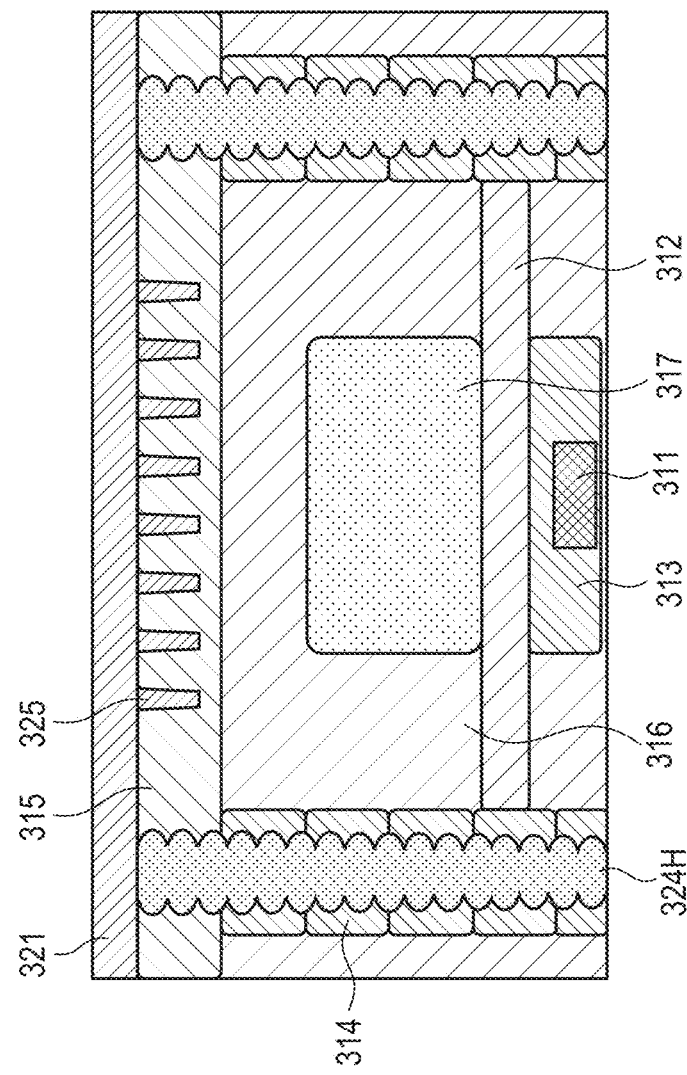
FIG. 11 is a schematic cross-sectional view of an avalanche photodiode according to a modified example of the first embodiment.

FIG. 11 is a schematic cross-sectional view of an APD 201 according to a modified example of the present embodiment. A pixel isolation portion 324H illustrated in FIG. 11 is arranged so as to penetrate the sensor substrate 11. This makes it possible to sufficiently obtain the effect of increasing the optical path length at every position in the depth direction in the semiconductor layer 300.

Figure 12:
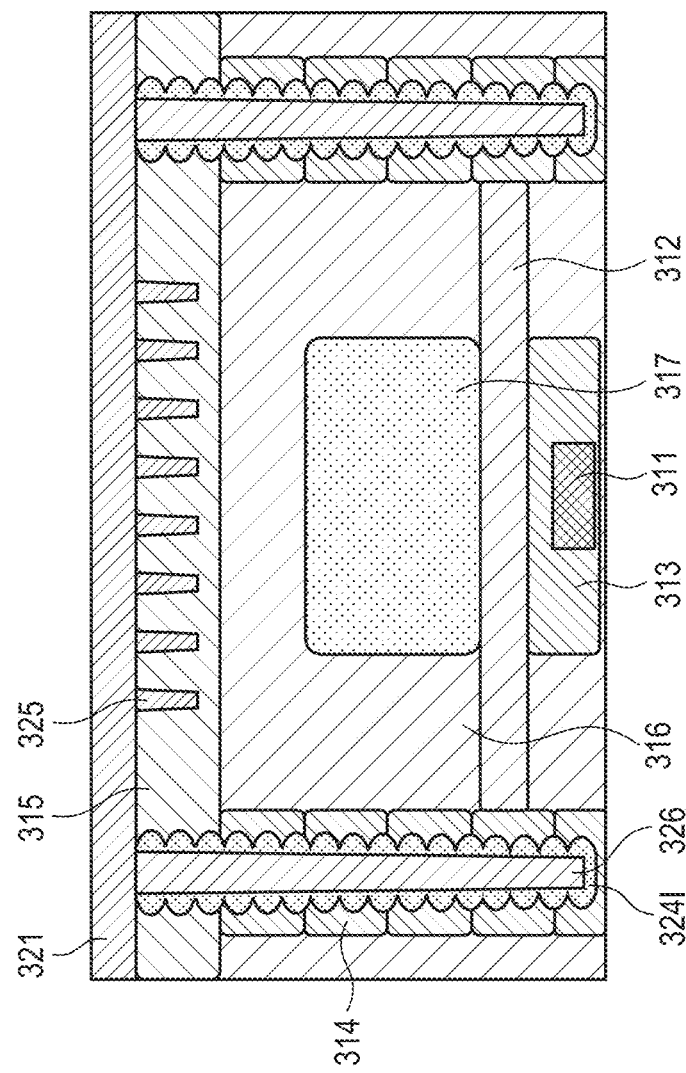
FIG. 12 is a schematic cross-sectional view of an avalanche photodiode according to a modified example of the first embodiment.

FIG. 12 is a schematic cross-sectional view of an APD 201 according to a modified example of the present embodiment. A light shielding layer 326 is buried in a pixel isolation portion 324I illustrated in FIG. 12. The light shielding layer 326 may be made of material whose light transmittance, at a wavelength in which the APD 201 has sensitivity, is lower than that of material of the sensor substrate 11 constituting the semiconductor layer 300. Thus, since light incident at an incident angle at which the light is not totally reflected by the sidewall of the pixel isolation portion 324I is reflected or absorbed by the light shielding layer 326, the leakage of the light to the adjacent pixels can be further reduced. Note that since the light transmittance of the metal material is sufficiently low, the material of the light shielding layer 326 is preferably metal. Further, the material of the light shielding layer 326 may be polysilicon, and effects similar to those obtained when the material of the light shielding layer 326 is metal can be obtained.

Figure 13:
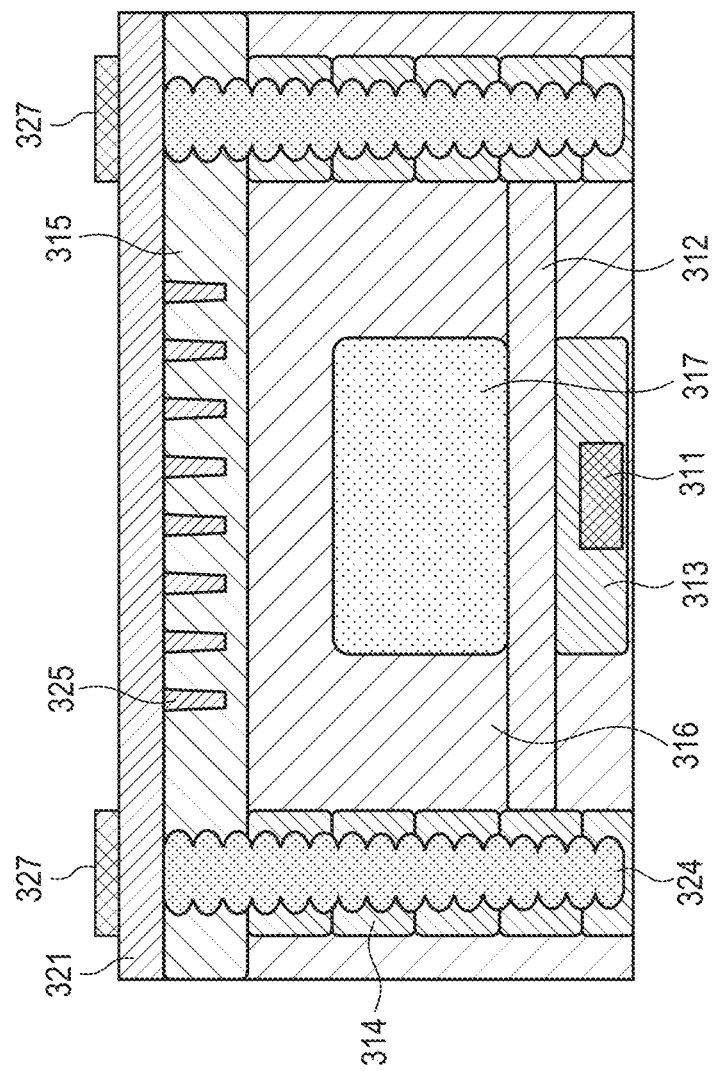
FIG. 13 is a schematic cross-sectional view of an avalanche photodiode according to a modified example of the first embodiment.

FIG. 13 is a schematic cross-sectional view of an APD 201 according to a modified example of the present embodiment. As illustrated in FIG. 13, a light shielding layer 327 such as a metal layer is arranged on the incident surface side with respect to the pixel isolation portion 324. Thus, noise caused by incident light to the pixel isolation portion 324 can be reduced. Note that the arrangement of the light shielding layer 327 is not limited to that illustrated in FIG. 13. For example, the light shielding layer 327 may be arranged on a surface opposite to the incident surface, or may be arranged on both the incident surface side and the opposite surface.

Second Embodiment

A second embodiment of the present disclosure will be described. In the description of the present embodiment, the description of elements common to those of the first embodiment may be omitted.

Figure 14:
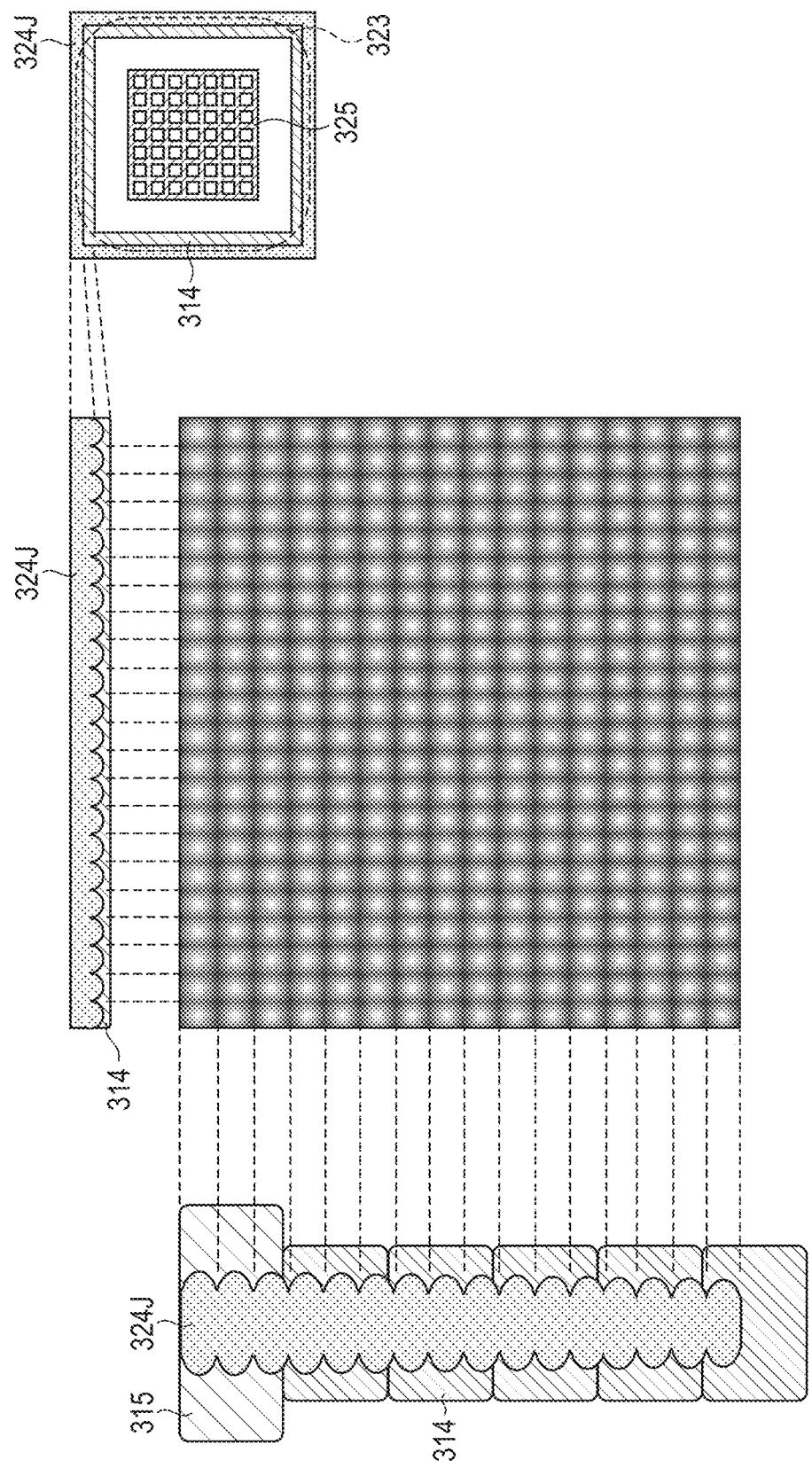
FIG. 14 is a diagram illustrating a structure of an avalanche photodiode according to a second embodiment.

FIG. 14 is a diagram illustrating a structure of an APD 201 according to the present embodiment. FIG. 14 illustrates, in addition to a schematic plan view similar to FIG. 6B and a schematic cross-sectional view similar to FIG. 7, a schematic plan view in which a pixel isolation portion 324J is enlarged and a plan view in a cross-sectional view from a direction perpendicular to the sidewall. As illustrated in the enlarged schematic plan view of the pixel isolation portion 324J of FIG. 14, a sidewall of the pixel isolation portion 324J has depressions and protrusions not only in the cross-sectional view but also in the plan view viewed from the light incident surface side. That is, as illustrated in the plan view of the sidewall, the side wall is provided with depressions and protrusions arranged two-dimensionally when viewed from a direction perpendicular to the sidewall. The depressions and protrusions have a structure in which the protrusions are repeatedly arranged in the depth direction and the lateral direction. This makes it possible to diffusely reflect more light as compared with the case where there are depressions and protrusions only in the depth direction of the sidewall, thereby further improving the sensitivity.

Hereinafter, modified examples of the present embodiment will be described. FIGS. 15A and 15B are schematic plan views of APDs 201 according to modified examples of the present embodiment. On a sidewall of a pixel isolation portion 324K illustrated in FIG. 15A, right-angled triangular protrusions are arranged in a plan view as viewed from the light incident surface side. In addition, on a sidewall of a pixel isolation portion 324L illustrated in FIG. 15B, trapezoidal protrusions are arranged in a plan view as viewed from the light incident surface side. That is, the shape of the depressions and protrusions in the plan view as viewed from the light incident surface side is not limited to the curved shape as illustrated in FIG. 14, and may be a shape including a polygon such as a triangle or a quadrangle as illustrated in FIGS. 15A and 15B. These shapes are merely examples, and a designer can appropriately design the shape of the depressions and protrusions of the pixel isolation portion in consideration of a tradeoff between the manufacturing cost due to the throughput at the time of forming the pixel isolation portion, the cost of photomasks, and the effect of the sensitivity improvement.

FIGS. 16A and 16B are schematic plan views of APDs 201 according to modified examples of the present embodiment. On a sidewall of a pixel isolation portion 324M illustrated in FIG. 16A, depressions and protrusions are arranged only in a part of the vicinity of the center in a plan view as viewed from the light incident surface side. In addition, on a sidewall of a pixel isolation portion 324N illustrated in FIG. 16B, depressions and protrusions are arranged only in a part near both ends in a plan view as viewed from the light incident surface side. In other words, the depressions and protrusions in the plan view as viewed from the light incident surface side are not limited to those arranged entirely as illustrated in FIG. 14, but may be arranged only partially as illustrated in FIGS. 16A and 16B. For example, as illustrated in FIG. 16A, in a configuration in which depressions and protrusions are arranged in the vicinity of the center of a side of the rectangle (square) formed by the pixel isolation portion 324M, photons generated by avalanche multiplication are effectively reflected, so that leakage of photons to adjacent pixels may be reduced.

Third Embodiment

Figure 17:
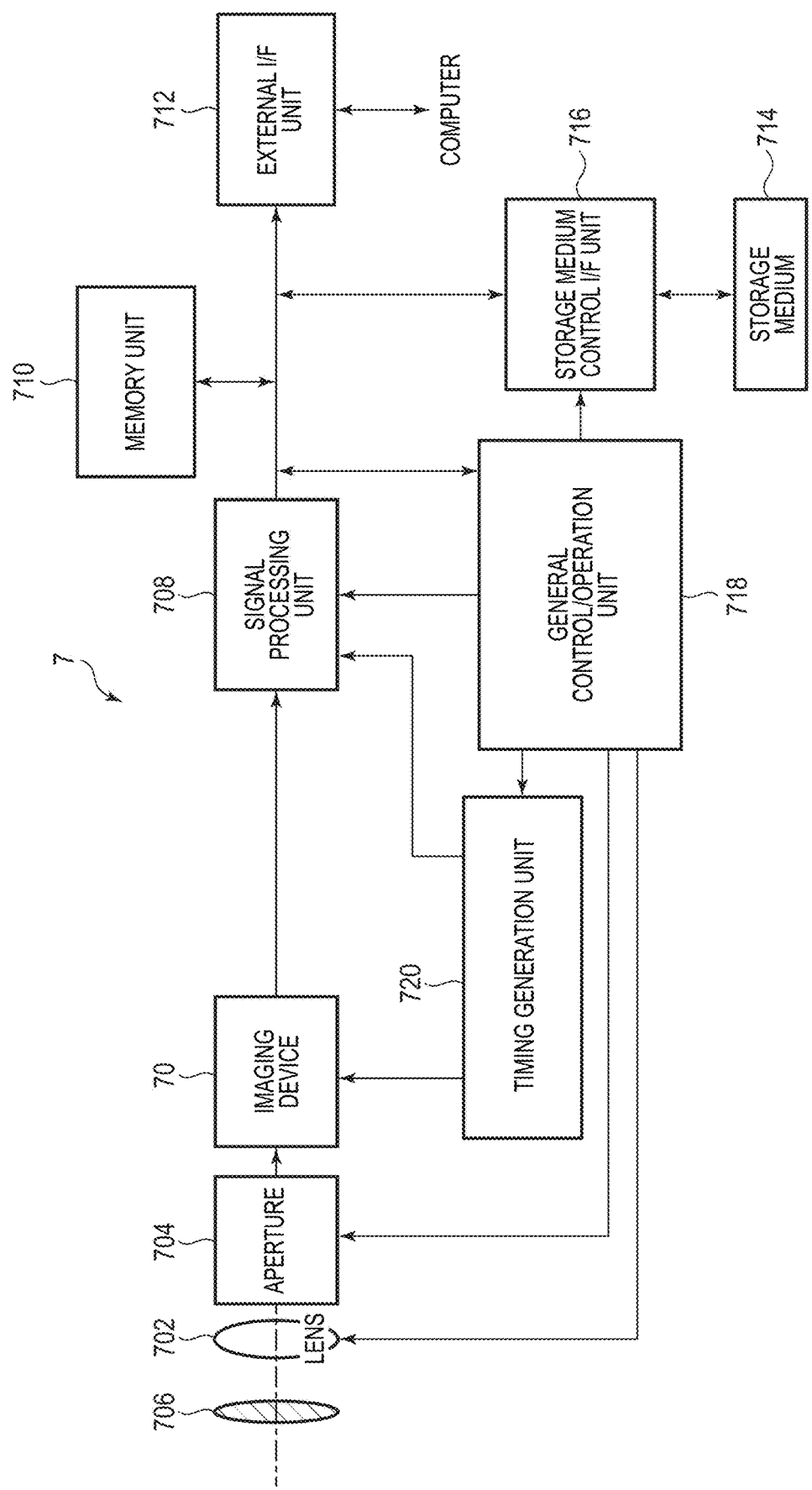
FIG. 17 is a block diagram of a light detection system according to a third embodiment.

A light detection system according to a third embodiment of the present disclosure will be described with reference to FIG. 17. FIG. 17 is a block diagram of a light detection system according to the present embodiment. The light detection system of the present embodiment is an imaging system that acquires an image based on incident light.

The photoelectric conversion device of the above-described embodiment may be applied to various imaging systems. Examples of the imaging system include a digital still camera, a digital camcorder, a camera head, a copying machine, a facsimile, a mobile phone, a vehicle-mounted camera, an observation satellite, and a surveillance camera. FIG. 17 is a block diagram of a digital still camera as an example of an imaging system.

The imaging system 7 illustrated in FIG. 17 includes a barrier 706, a lens 702, an aperture 704, an imaging device 70, a signal processing unit 708, a timing generation unit 720, a general control/operation unit 718, a memory unit 710, a storage medium control I/F unit 716, a storage medium 714, and an external I/F unit 712. The barrier 706 protects the lens, and the lens 702 forms an optical image of an object on the imaging device 70. The aperture 704 varies an amount of light passing through the lens 702. The imaging device 70 is configured as in the photoelectric conversion device of the above-described embodiment, and converts an optical image formed by the lens 702 into image data. The signal processing unit 708 performs various kinds of correction, data compression, and the like on the imaging data output from the imaging device 70.

The timing generation unit 720 outputs various timing signals to the imaging device 70 and the signal processing unit 708. The general control/operation unit 718 controls the entire digital still camera, and the memory unit 710 temporarily stores image data. The storage medium control I/F unit 716 is an interface for storing or reading out image data on the storage medium 714, and the storage medium 714 is a detachable storage medium such as a semiconductor memory for storing or reading out image data. The external I/F unit 712 is an interface for communicating with an external computer or the like. The timing signal or the like may be input from the outside of the imaging system 7, and the imaging system 7 may include at least the imaging device 70 and the signal processing unit 708 that processes an image signal output from the imaging device 70.

In the present embodiment, the imaging device 70 and the signal processing unit 708 may be arranged in the same semiconductor substrate. Further, the imaging device 70 and the signal processing unit 708 may be arranged in different semiconductor substrates.

Further, each pixel of the imaging device 70 may include a first photoelectric conversion unit and a second photoelectric conversion unit. The signal processing unit 708 processes a pixel signal based on a charge generated in the first photoelectric conversion unit and a pixel signal based on a charge generated in the second photoelectric conversion unit, and acquires the distance information from the imaging device 70 to the object.

Fourth Embodiment

Figure 18:
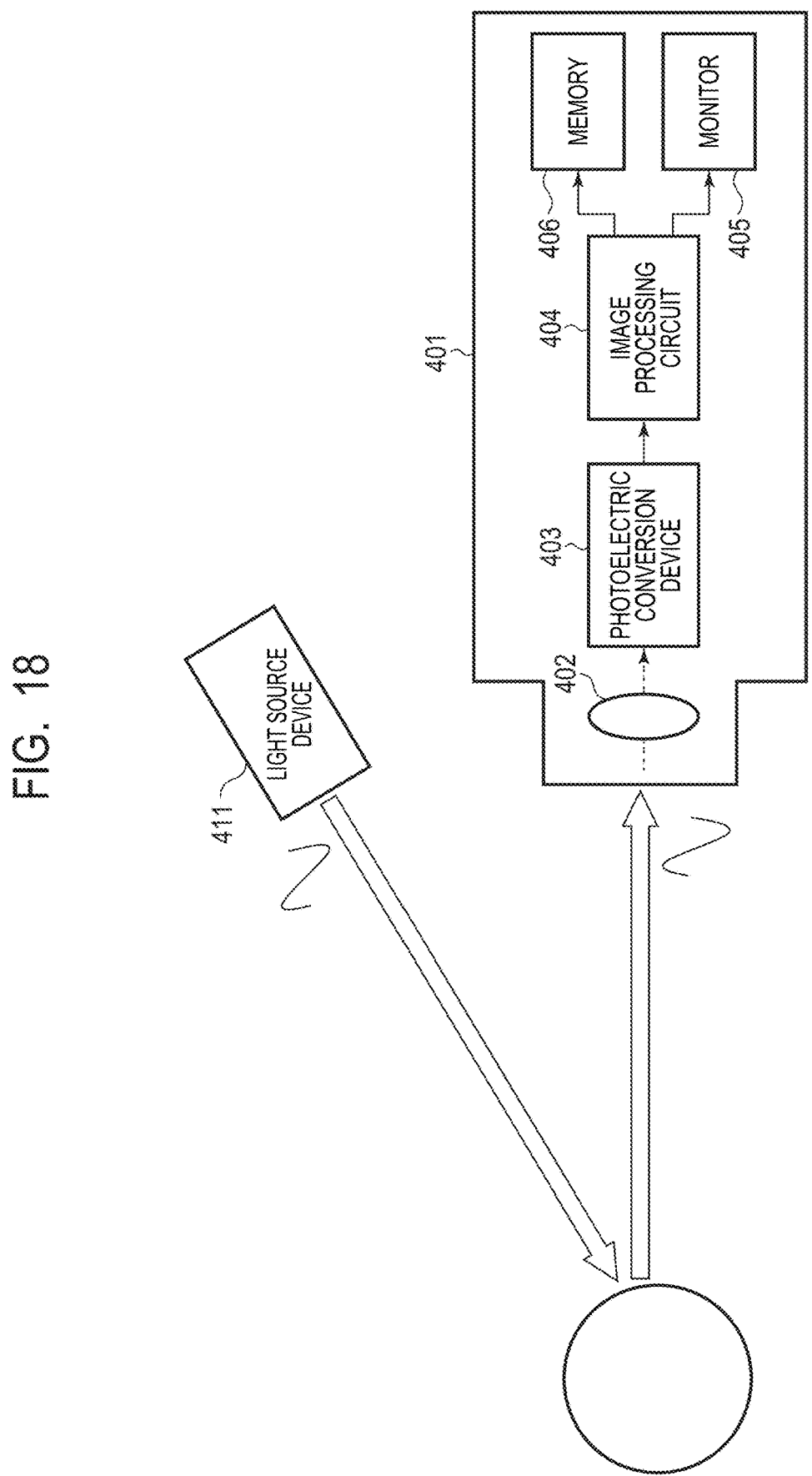
FIG. 18 is a block diagram of a light detection system according to a fourth embodiment.

FIG. 18 is a block diagram of a light detection system according to the present embodiment. More specifically, FIG. 18 is a block diagram of a distance image sensor using the photoelectric conversion device described in the above embodiment.

As illustrated in FIG. 18, the distance image sensor 401 includes an optical system 402, a photoelectric conversion device 403, an image processing circuit 404, a monitor 405, and a memory 406. The distance image sensor 401 receives light (modulated light or pulse light) emitted from the light source device 411 toward an object and reflected by the surface of the object. The distance image sensor 401 can acquire a distance image corresponding to a distance to the object based on a time period from light emission to light reception.

The optical system 402 includes one or a plurality of lenses, and guides image light (incident light) from the object to the photoelectric conversion device 403 to form an image on a light receiving surface (sensor unit) of the photoelectric conversion device 403.

As the photoelectric conversion device 403, the photoelectric conversion device of each of the embodiments described above can be applied. The photoelectric conversion device 403 supplies a distance signal indicating a distance obtained from the received light signal to the image processing circuit 404.

The image processing circuit 404 performs image processing for constructing a distance image based on the distance signal supplied from the photoelectric conversion device 403. The distance image (image data) obtained by the image processing can be displayed on the monitor 405 and stored (recorded) in the memory 406.

The distance image sensor 401 configured in this manner can acquire an accurate distance image by applying the photoelectric conversion device described above.

Fifth Embodiment

The technology according to the present disclosure can be applied to various products. For example, the technology according to the present disclosure may be applied to an endoscopic surgical system, which is an example of a light detection system.

Figure 19:
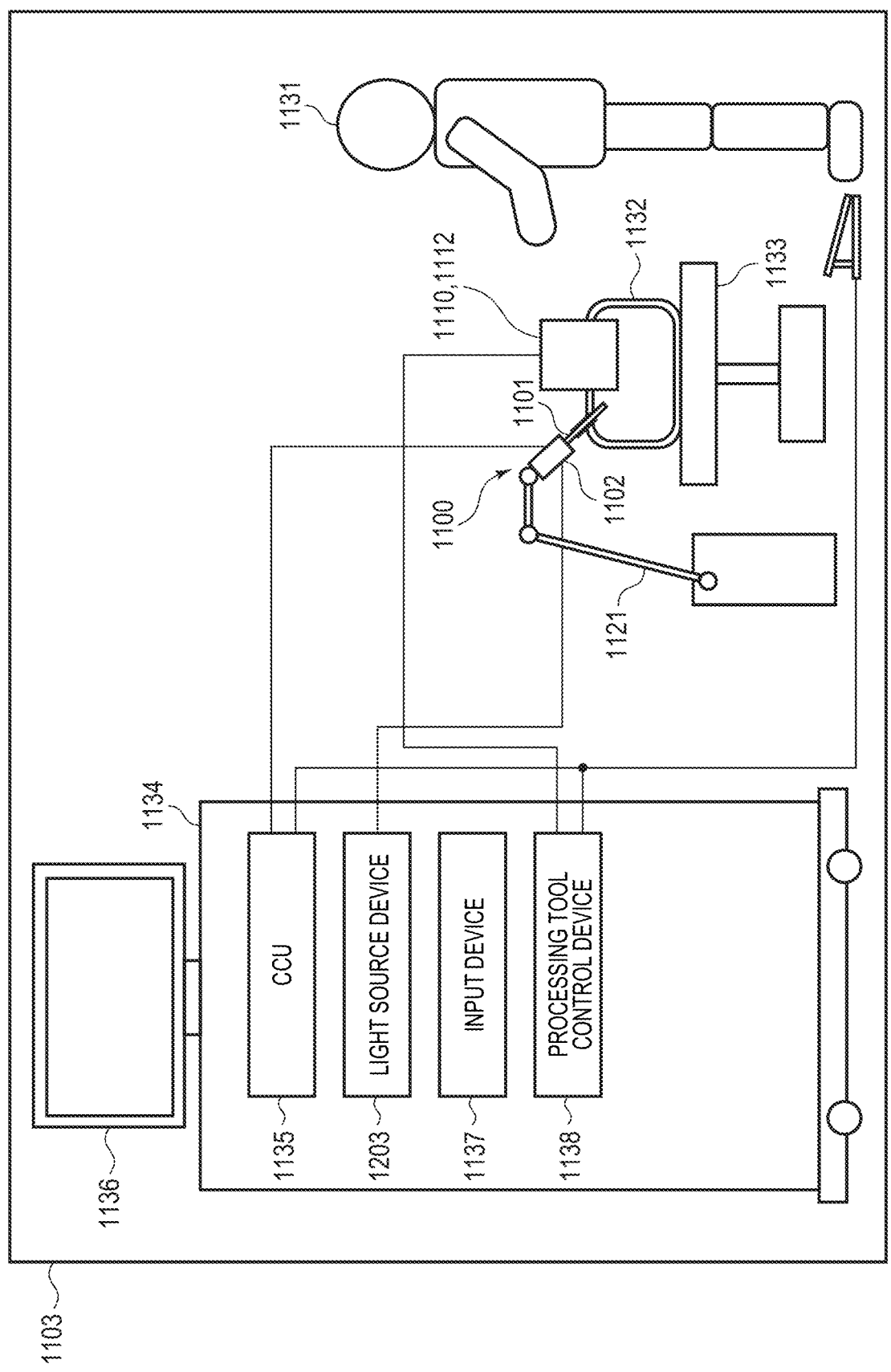
FIG. 19 is a schematic diagram of an endoscopic surgical system according to a fifth embodiment.

FIG. 19 is a schematic diagram of an endoscopic surgical system according to the present embodiment. FIG. 19 illustrates a state in which an operator (physician) 1131 performs surgery on a patient 1132 on a patient bed 1133 using an endoscopic surgical system 1103. As illustrated, the endoscopic surgical system 1103 includes an endoscope 1100, a surgical tool 1110, an arm 1121, and a cart 1134 on which various devices for endoscopic surgery are mounted.

The endoscope 1100 includes a barrel 1101 in which an area of a predetermined length from the distal end is inserted into a body cavity of a patient 1132, and a camera head 1102 connected to a proximal end of the barrel 1101. FIG. 19 illustrates an endoscope 1100 configured as a rigid scope having a rigid barrel 1101, but the endoscope 1100 may be configured as a flexible scope having a flexible barrel.

An opening into which an objective lens is fitted is provided at the distal end of the barrel 1101. A light source device 1203 is connected to the endoscope 1100. Light generated by the light source device 1203 is guided to the distal end of the barrel 1101 by a light guide extended inside the barrel 1101, and is irradiated to an observation target in the body cavity of the patient 1132 via an objective lens. The endoscope 1100 may be a straight-viewing scope an oblique-viewing scope, or a side-viewing scope.

An optical system and a photoelectric conversion device are provided inside the camera head 1102, and reflected light (observation light) from the observation target is focused on the photoelectric conversion device by the optical system. The observation light is photoelectrically converted by the photoelectric conversion device, and an electric signal corresponding to the observation light, that is, an image signal corresponding to an observation image is generated. As the photoelectric conversion device, the photoelectric conversion device described in each of the above embodiments can be used. The image signal is transmitted to a camera control unit (CCU) 1135 as RAW data.

The CCU 1135 includes a central processing unit (CPU), a graphics processing unit (GPU), and the like, and integrally controls operations of the endoscope 1100 and a display device 1136. Further, the CCU 1135 receives an image signal from the camera head 1102, and performs various types of image processing for displaying an image based on the image signal, such as development processing (demosaic processing).

The display device 1136 displays an image based on the image signal processed by the CCU 1135 under the control of the CCU 1135.

The light source device 1203 includes, for example, a light source such as a light emitting diode (LED), and supplies irradiation light to the endoscope 1100 when capturing an image of a surgical site or the like.

An input device 1137 is an input interface for the endoscopic surgical system 1103. The user can input various types of information and instructions to the endoscopic surgical system 1103 via the input device 1137.

A processing tool control device 1138 controls the actuation of the energy treatment tool 1112 for ablation of tissue, incision, sealing of blood vessels, and the like.

The light source device 1203 can supply irradiation light to the endoscope 1100 when capturing an image of a surgical site, and may be, for example, a white light source such as an LED, a laser light source, or a combination thereof. When a white light source is constituted by a combination of RGB laser light sources, the output intensity and output timing of each color (each wavelength) can be controlled with high accuracy. Therefore, the white balance of the captured image can be adjusted in the light source device 1203. In this case, laser light from each of the RGB laser light sources may be irradiated onto the observation target in a time-division manner, and driving of the imaging element of the camera head 1102 may be controlled in synchronization with the irradiation timing. Thus, images corresponding to R, G, and B can be captured in a time-division manner. According to such a method, a color image can be obtained without providing a color filter in the imaging element.

Further, the driving of the light source device 1203 may be controlled so that the intensity of the light output from the light source device 1203 is changed at predetermined time intervals. By controlling the driving of the imaging element of the camera head 1102 in synchronization with the timing of changing the intensity of light to acquire images in a time-division manner, and by synthesizing the images, it is possible to generate an image in a high dynamic range without so-called black out and white out.

Further, the light source device 1203 may be configured to be capable of supplying light in a predetermined wavelength band corresponding to special light observation. In the special light observation, for example, wavelength dependency of absorption of light in body tissue can be utilized. Specifically, predetermined tissues such as blood vessels in the surface layer of the mucosa are photographed with high contrast by irradiating light in a narrower band compared to the irradiation light (that is, white light) during normal observation. Alternatively, in the special light observation, fluorescence observation for obtaining an image by fluorescence generated by irradiation with excitation light may be performed. In the fluorescence observation, the body tissue can be irradiated with excitation light to observe fluorescence from the body tissue, or a reagent such as indocyanine green (ICG) can be locally injected to the body tissue and the body tissue can be irradiated with excitation light corresponding to the fluorescence wavelength of the reagent to obtain a fluorescence image. The light source device 1203 may be configured to supply narrowband light and/or excitation light corresponding to such special light observation.

Sixth Embodiment

A light detection system and A movable body of the present embodiment will be described with reference to FIGS. 20, 21A, 21B, 21C, and 22. In the present embodiment, an example of an in-vehicle camera is illustrated as a light detection system.

Figure 20:
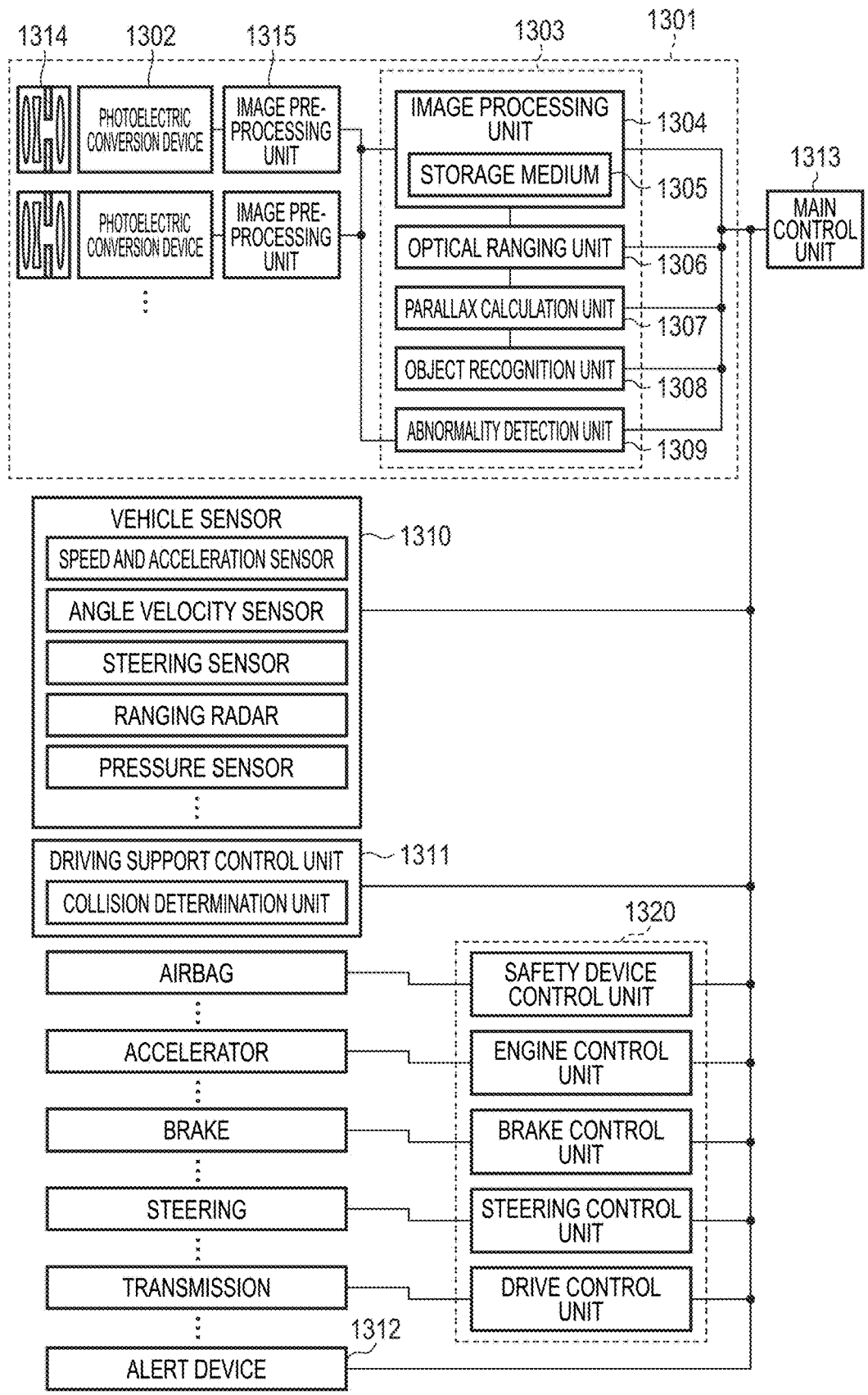
FIG. 20 is a schematic diagram of a light detection system according to a sixth embodiment.

FIG. 20 is a schematic diagram of a light detection system according to the present embodiment, and illustrates an example of a vehicle system and a light detection system mounted on the vehicle system. The light detection system 1301 includes photoelectric conversion devices 1302, image pre-processing units 1315, an integrated circuit 1303, and optical systems 1314. The optical system 1314 forms an optical image of an object on the photoelectric conversion device 1302. The photoelectric conversion device 1302 converts the optical image of the object formed by the optical system 1314 into an electric signal. The photoelectric conversion device 1302 is the photoelectric conversion device of any one of the above-described embodiments. The image pre-processing unit 1315 performs predetermined signal processing on the signal output from the photoelectric conversion device 1302. The function of the image pre-processing unit 1315 may be incorporated in the photoelectric conversion device 1302. The light detection system 1301 is provided with at least two sets of the optical system 1314, the photoelectric conversion device 1302, and the image pre-processing unit 1315, and an output signal from the image pre-processing units 1315 of each set is input to the integrated circuit 1303.

The integrated circuit 1303 is an integrated circuit for use in an imaging system, and includes an image processing unit 1304 including a storage medium 1305, an optical ranging unit 1306, a parallax calculation unit 1307, an object recognition unit 1308, and an abnormality detection unit 1309. The image processing unit 1304 performs image processing such as development processing and defect correction on the output signal of the image pre-processing unit 1315. The storage medium 1305 performs primary storage of captured images and stores defect positions of image capturing pixels. The optical ranging unit 1306 focuses or measures the object. The parallax calculation unit 1307 calculates distance measurement information from the plurality of image data acquired by the plurality of photoelectric conversion devices 1302. The object recognition unit 1308 recognizes an object such as a car, a road, a sign, or a person. When the abnormality detection unit 1309 detects the abnormality of the photoelectric conversion device 1302, the abnormality detection unit 1309 issues an abnormality to the main control unit 1313.

The integrated circuit 1303 may be realized by dedicated hardware, a software module, or a combination thereof. It may be realized by a field programmable gate array (FPGA), an application specific integrated circuit (ASIC), or the like, or may be realized by a combination of these.

The main control unit 1313 controls overall operations of the light detection system 1301, a vehicle sensor 1310, a control unit 1320, and the like. Without the main control unit 1313, the light detection system 1301, the vehicle sensor 1310, and the control unit 1320 may individually have a communication interface, and each of them may transmit and receive control signals via a communication network, for example, according to the CAN standard.

The integrated circuit 1303 has a function of transmitting a control signal or a setting value to the photoelectric conversion device 1302 by receiving a control signal from the main control unit 1313 or by its own control unit.

The light detection system 1301 is connected to the vehicle sensor 1310, and can detect a traveling state of the host vehicle such as a vehicle speed, a yaw rate, a steering angle, and the like, an environment outside the host vehicle, and states of other vehicles and obstacles. The vehicle sensor 1310 is also a distance information acquisition unit that acquires distance information to the object. The light detection system 1301 is connected to a driving support control unit 1311 that performs various driving support functions such as an automatic steering function, an automatic cruise function, and a collision prevention function. In particular, with regard to the collision determination function, based on detection results of the light detection system 1301 and the vehicle sensor 1310, it is determined whether or not there is a possibility or occurrence of collision with another vehicle or an obstacle. Thus, avoidance control is performed when a possibility of collision is estimated and a safety device is activated when collision occurs.

The light detection system 1301 is also connected to an alert device 1312 that issues an alarm to a driver based on a determination result of the collision determination unit. For example, when the possibility of collision is high as the determination result of the collision determination unit, the main control unit 1313 performs vehicle control such as braking, returning an accelerator, suppressing engine output, or the like, thereby avoiding collision or reducing damage. The alert device 1312 issues a warning to a user using means such as an alarm of a sound or the like, a display of alarm information on a display unit screen such as a car navigation system and a meter panel, and a vibration application to a seatbelt and a steering wheel.

Figure 21A:
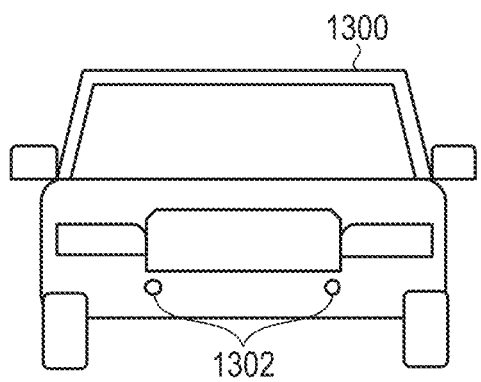
FIGS. 21A, 21B, and 21C are schematic diagrams of a movable body according to a sixth embodiment.
Figure 21B:
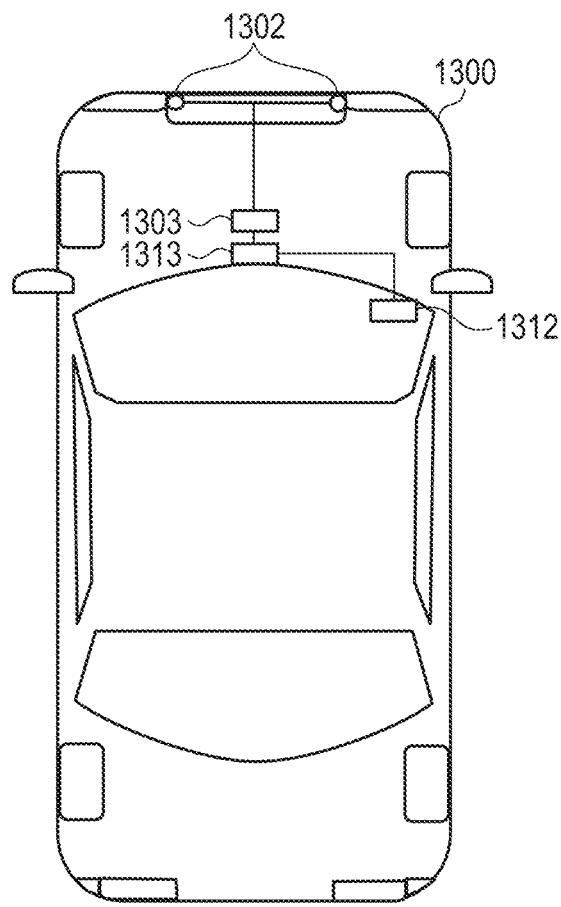
Figure 21C:
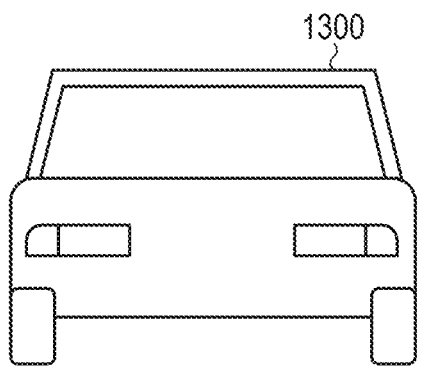

The light detection system 1301 according to the present embodiment can capture an image around the vehicle, for example, the front or the rear. FIGS. 21A, 21B, and 21C are schematic diagrams of a movable body according to the present embodiment, and illustrate a configuration in which an image of the front of the vehicle is captured by the light detection system 1301.

The two photoelectric conversion devices 1302 are arranged in front of the vehicle 1300. Specifically, it is preferable that a center line with respect to a forward/backward direction or an outer shape (for example, a vehicle width) of the vehicle 1300 be regarded as a symmetry axis, and two photoelectric conversion devices 1302 be arranged in line symmetry with respect to the symmetry axis. This makes it possible to effectively acquire distance information between the vehicle 1300 and the object to be imaged and determine the possibility of collision. Further, it is preferable that the photoelectric conversion device 1302 be arranged at a position where it does not obstruct the field of view of the driver when the driver sees a situation outside the vehicle 1300 from the driver's seat. The alert device 1312 is preferably arranged at a position that is easy to enter the field of view of the driver.

Figure 22:
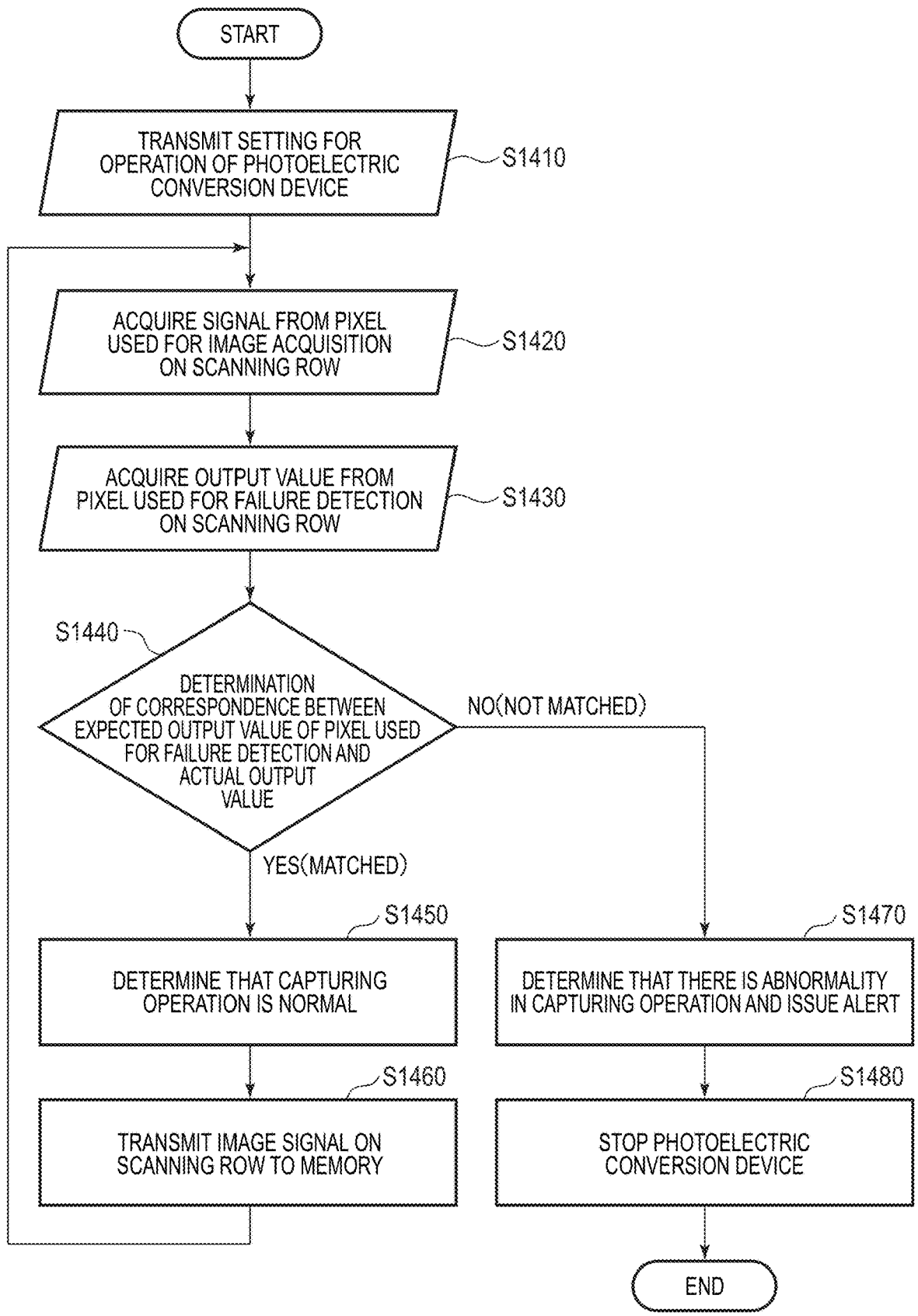
FIG. 22 is a flowchart illustrating an operation of the light detection system according to the sixth embodiment.

Next, a failure detection operation of the photoelectric conversion device 1302 in the light detection system 1301 will be described with reference to FIG. 22. FIG. 22 is a flowchart illustrating an operation of the light detection system according to the present embodiment. The failure detection operation of the photoelectric conversion device 1302 may be performed according to steps S1410 to S1480 illustrated in FIG. 22.

In step S1410, the setting at the time of startup of the photoelectric conversion device 1302 is performed. That is, setting information for the operation of the photoelectric conversion device 1302 is transmitted from the outside of the light detection system 1301 (for example, the main control unit 1313) or the inside of the light detection system 1301, and the photoelectric conversion device 1302 starts an imaging operation and a failure detection operation.

Next, in step S1420, the photoelectric conversion device 1302 acquires pixel signals from the effective pixels. In step S1430, the photoelectric conversion device 1302 acquires an output value from a failure detection pixel provided for failure detection. The failure detection pixel includes a photoelectric conversion element in the same manner as the effective pixel. A predetermined voltage is written to the photoelectric conversion element. The failure detection pixel outputs a signal corresponding to the voltage written in the photoelectric conversion element. Steps S1420 and S1430 may be executed in reverse order.

Next, in step S1440, the light detection system 1301 performs a determination of correspondence between the expected output value of the failure detection pixel and the actual output value from the failure detection pixel. If it is determined in step S1440 that the expected output value matches the actual output value, the light detection system 1301 proceeds with the process to step S1450, determines that the imaging operation is normally performed, and proceeds with the process to step S1460. In step S1460, the light detection system 1301 transmits the pixel signals of the scanning row to the storage medium 1305 and temporarily stores them. Thereafter, the process of the light detection system 1301 returns to step S1420 to continue the failure detection operation. On the other hand, as a result of the determination in step S1440, if the expected output value does not match the actual output value, the light detection system 1301 proceeds with the process to step S1470. In step S1470, the light detection system 1301 determines that there is an abnormality in the imaging operation, and issues an alert to the main control unit 1313 or the alert device 1312. The alert device 1312 causes the display unit to display that an abnormality has been detected. Then, in step S1480, the light detection system 1301 stops the photoelectric conversion device 1302 and ends the operation of the light detection system 1301.

Although the present embodiment exemplifies the example in which the flowchart is looped for each row, the flowchart may be looped for each plurality of rows, or the failure detection operation may be performed for each frame. The alert of step S1470 may be notified to the outside of the vehicle via a wireless network.

Further, in the present embodiment, the control in which the vehicle does not collide with another vehicle has been described, but the present embodiment is also applicable to a control in which the vehicle is automatically driven following another vehicle, a control in which the vehicle is automatically driven so as not to protrude from the lane, and the like. Further, the light detection system 1301 can be applied not only to a vehicle such as a host vehicle, but also to a movable body (movable apparatus) such as a ship, an aircraft, or an industrial robot. In addition, the present embodiment can be applied not only to a movable body but also to an apparatus utilizing object recognition such as an intelligent transport systems (ITS).

The photoelectric conversion device of the present disclosure may be a configuration capable of further acquiring various types of information such as distance information.

Seventh Embodiment

Figure 23A:
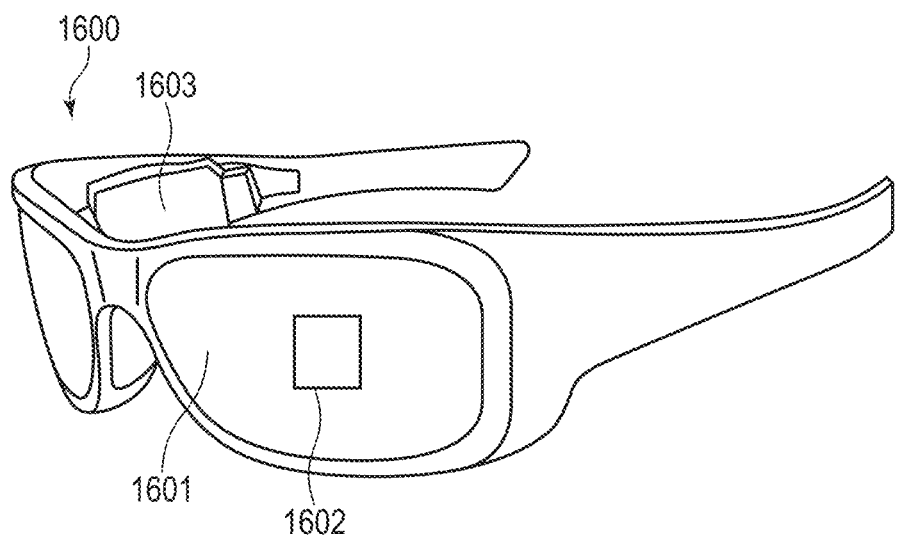
FIGS. 23A and 23B are diagrams illustrating a specific example of an electronic device according to a seventh embodiment.

FIG. 23A is a diagram illustrating a specific example of an electronic device according to the present embodiment, and illustrates glasses 1600 (smart glasses). The glasses 1600 are provided with the photoelectric conversion device 1602 described in the above embodiments. That is, the glasses 1600 are an example of a light detection system to which the photoelectric conversion device 1602 described in each of the above embodiments can be applied. A display device including a light emitting device such as an OLED or an LED may be provided on the back surface side of the lens 1601. One photoelectric conversion device 1602 or a plurality of photoelectric conversion devices 1602 may be provided. Further, a plurality of types of photoelectric conversion devices may be combined. The arrangement position of the photoelectric conversion device 1602 is not limited to that illustrated in FIG. 23A.

The glasses 1600 further comprise a control device 1603. The control device 1603 functions as a power source for supplying power to the photoelectric conversion device 1602 and the above-described display device. The control device 1603 controls operations of the photoelectric conversion device 1602 and the display device. The lens 1601 is provided with an optical system for collecting light to the photoelectric conversion device 1602.

Figure 23B:
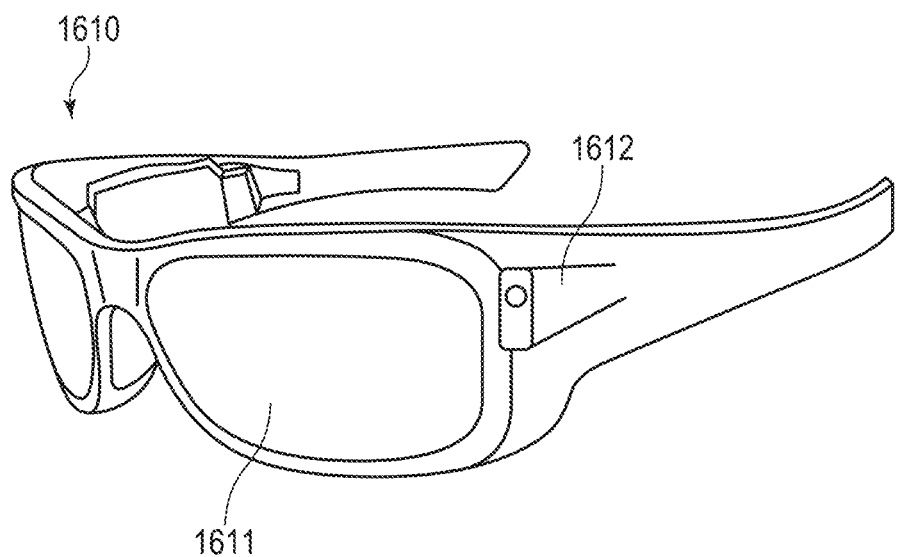

FIG. 23B illustrates glasses 1610 (smart glasses) according to one application. The glasses 1610 include a control device 1612, and a photoelectric conversion device corresponding to the photoelectric conversion device 1602 and a display device are mounted on the control device 1612. The lens 1611 is provided with a photoelectric conversion device in the control device 1612 and an optical system for projecting light emitted from a display device, and an image is projected on the lens 1611. The control device 1612 functions as a power source for supplying power to the photoelectric conversion device and the display device, and controls operations of the photoelectric conversion device and the display device. The control device 1612 may include a line-of-sight detection unit that detects the line of sight of the wearer. Infrared radiation may be used to detect the line of sight. The infrared light emitting unit emits infrared light to the eyeball of the user who is watching the display image. The reflected light of the emitted infrared light from the eyeball is detected by an imaging unit having a light receiving element, whereby a captured image of the eyeball is obtained. A reduction unit that reduces light from the infrared light emitting unit to the display unit in a plan view may be employed and the reduction unit reduces a degradation in image quality.

The control device 1612 detects the line of sight of the user with respect to the display image from the captured image of the eyeball obtained by imaging the infrared light. Any known method can be applied to the line-of-sight detection using the captured image of the eyeball. As an example, a line-of-sight detection method based on a Purkinje image due to reflection of irradiation light at a cornea can be used.

More specifically, a line-of-sight detection process based on a pupil cornea reflection method is performed. By using the pupil cornea reflection method, a line-of-sight vector representing a direction (rotation angle) of the eyeball is calculated based on the image of the pupil included in the captured image of the eyeball and the Purkinje image, whereby the line-of-sight of the user is detected.

The display device of the present embodiment may include a photoelectric conversion device having a light receiving element, and may control a display image of the display device based on line-of-sight information of the user from the photoelectric conversion device.

Specifically, the display device determines a first view field region gazed by the user and a second view field region other than the first view field region based on the line-of-sight information. The first view field region and the second view field region may be determined by a control device of the display device, or may be determined by an external control device. In the display area of the display device, the display resolution of the first view field region may be controlled to be higher than the display resolution of the second view field region. That is, the resolution of the second view field region may be lower than that of the first view field region.

The display area may include a first display region and a second display region different from the first display region. A region having a high priority may be determined from the first display region and the second display region based on the line-of-sight information. The first view field region and the second view field region may be determined by a control device of the display device, or may be determined by an external control device. The resolution of the high priority area may be controlled to be higher than the resolution of the region other than the high priority region. That is, the resolution of a region having a relatively low priority can be reduced.

It should be noted that an artificial intelligence (AI) may be used in determining the first view field region and the region with high priority. The AI may be a model configured to estimate an angle of a line of sight and a distance to a target on the line-of-sight from an image of an eyeball, and the AI may be trained using training data including images of an eyeball and an angle at which the eyeball in the images actually gazes. The AI program may be provided in either a display device or a photoelectric conversion device, or may be provided in an external device. When the external device has the AI program, the AI program may be transmitted from a server or the like to a display device via communication.

When the display control is performed based on the line-of-sight detection, the present embodiment can be preferably applied to a smart glasses which further includes a photoelectric conversion device for capturing an image of the outside. The smart glasses can display captured external information in real time.

Modified Embodiments

The present invention is not limited to the above embodiment, and various modifications are possible. For example, an example in which some of the configurations of any of the embodiments are added to other embodiments or an example in which some of the configurations of any of the embodiments are replaced with some of the configurations of other embodiments is also an embodiment of the present invention.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-166309, filed Oct. 8, 2021, which is hereby incorporated by reference herein in its entirety.

What is claimed is:

1. A photoelectric conversion device comprising:
   a substrate;
   a photoelectric conversion unit arranged in the substrate and configured to generate charges corresponding to incident light;
   a pixel isolation portion arranged in the substrate and isolating the photoelectric conversion unit from other elements; and
   a semiconductor region arranged in the substrate and having a conductivity type different from a conductivity type of the charges,
   wherein the pixel isolation portion is arranged inside the semiconductor region,
   wherein the semiconductor region includes a plurality of regions along a normal direction of a surface of the substrate,
   wherein a sidewall of the pixel isolation portion has a plurality of depressions and protrusions in a cross-sectional view,
   wherein a period of at least a part of the plurality of depressions and protrusions is greater than ½ of a wavelength of light to which the photoelectric conversion unit has sensitivity, and wherein a length of one region of the plurality of regions along the normal direction is greater than a distance between adjacent protrusions of the plurality of depressions and protrusions.

2. The photoelectric conversion device according to claim 1, wherein the plurality of depressions and protrusions is two-dimensionally arranged in a cross-sectional view from a direction perpendicular to the sidewall.

3. The photoelectric conversion device according to claim 1, wherein the substrate has depressions and protrusions arranged on an incident surface of the photoelectric conversion unit.

4. The photoelectric conversion device according to claim 1, wherein the photoelectric conversion unit includes an avalanche photodiode.

5. The photoelectric conversion device according to claim 4, wherein the plurality of depressions and protrusions is arranged at least at a depth at which avalanche multiplication occurs in the avalanche photodiode.

6. The photoelectric conversion device according to claim 1, wherein the pixel isolation portion has a rectangular shape surrounding the photoelectric conversion unit in a plan view with respect to the substrate.

7. The photoelectric conversion device according to claim 6, wherein the plurality of depressions and protrusions is arranged at least in a center of one side of the rectangular shape.

8. The photoelectric conversion device according to claim 1, wherein the pixel isolation portion is arranged so as to penetrate the substrate.

9. The photoelectric conversion device according to claim 1, wherein material whose light transmittance, at a wavelength in which the photoelectric conversion unit has sensitivity, is lower than that of material of the substrate is buried in at least a part of the pixel isolation portion.

10. The photoelectric conversion device according to claim 9, wherein metal is buried in at least a part of the pixel isolation portion.

11. The photoelectric conversion device according to claim 9, wherein polysilicon is buried in at least a part of the pixel isolation portion.

12. The photoelectric conversion device according to claim 1 further comprising a light shielding layer arranged on at least one of a side of an incident surface of the incident light and a side opposite to the incident surface.

13. The photoelectric conversion device according to claim 1, wherein a period of at least a part of the plurality of depressions and protrusions is greater than 325 nm.

14. The photoelectric conversion device according to claim 1, wherein a period of at least a part of the plurality of depressions and protrusions is less than 4 μm.

15. A light detection system comprising:
the photoelectric conversion device according to claim 1; and
a signal processing unit configured to process a signal output from the photoelectric conversion device.

16. A movable body comprising:
the photoelectric conversion device according to claim 1;
a distance information acquisition unit configured to acquire distance information to an object from a signal output from the photoelectric conversion device; and
a control unit configured to control the movable body based on the distance information.

17. The photoelectric conversion device according to claim 1, wherein the distance between adjacent protrusions of the plurality of depressions and protrusions is greater than ½ of the wavelength of light to which the photoelectric conversion unit has sensitivity.

18. The photoelectric conversion device according to claim 1, wherein the plurality of depressions and protrusions has a periodic depressions and protrusions structure, and a periodic distance of at least a part of the depressions and protrusions structure is greater than ½ of the wavelength of light to which the photoelectric conversion unit has sensitivity.

* * * * *